US012593556B2

(12) United States Patent
Lee et al.

(10) Patent No.: US 12,593,556 B2
(45) Date of Patent: Mar. 31, 2026

(54) DISPLAY DEVICE HAVING TRUNCATED CONE SHAPED LIGHT EMITTING ELEMENT

(71) Applicant: Samsung Display Co., LTD., Yongin-si (KR)

(72) Inventors: Byung Ju Lee, Seoul (KR); Seung Geun Lee, Hwaseong-si (KR); Hoo Keun Park, Yongin-si (KR); Won Sik Oh, Hwaseong-si (KR); Seung A Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 583 days.

(21) Appl. No.: 17/474,688

(22) Filed: Sep. 14, 2021

(65) Prior Publication Data

US 2022/0109023 A1 Apr. 7, 2022

(30) Foreign Application Priority Data

Oct. 6, 2020 (KR) ........................ 10-2020-0128610

(51) Int. Cl.
*H10H 29/14* (2025.01)
*H10H 20/821* (2025.01)
(Continued)

(52) U.S. Cl.
CPC ........ *H10H 29/142* (2025.01); *H10H 20/821* (2025.01); *H10H 20/831* (2025.01); *H10H 20/84* (2025.01)

(58) Field of Classification Search
CPC ....... H01L 27/156; H01L 33/24; H01L 33/38; H01L 33/44; H01L 33/20; H01L 33/62;
(Continued)

(56) References Cited

U.S. PATENT DOCUMENTS 8,426,227 B1 4/2013 Bibl et al.
8,552,436 B2 10/2013 Bibl et al.
(Continued)

FOREIGN PATENT DOCUMENTS

KR 10-2014-0108228 A 9/2014
KR 10-1490758 2/2015
(Continued)

OTHER PUBLICATIONS

Korean Office Action for KR Application No. 10-2020-0128610, dated Jun. 2, 2025, 8 pages.

*Primary Examiner* — Duy T Nguyen
*Assistant Examiner* — Zhijun Xu
(74) *Attorney, Agent, or Firm* — Womble Bond Dickinson (US) LLP

(57) ABSTRACT

A display device includes a first electrode and a second electrode spaced apart from each other and disposed on a substrate, a light emitting element extending in a first direction and including a first end disposed on the first electrode in the first direction and a second end disposed on the second electrode in the first direction. A diameter of the first end of the light emitting element is different from a diameter of the second end of the light emitting element. The light emitting element includes a first semiconductor layer, a second semiconductor layer spaced apart from the first semiconductor layer, and an active layer disposed between the first semiconductor layer and the second semiconductor layer. The active layer is adjacent to one of the first end and the second end of the light emitting element, which has a larger diameter than a diameter of the other.

20 Claims, 14 Drawing Sheets

(51) Int. Cl.
  *H10H 20/831* (2025.01)
  *H10H 20/84* (2025.01)

(58) Field of Classification Search
  CPC ... H01L 25/0753; H01L 33/60; H01L 25/167;
      H01L 27/1214; H01L 33/325
  See application file for complete search history.

(56) References Cited

U.S. PATENT DOCUMENTS

| | | | |
|---|---|---|---|
| 8,558,243 B2 | 10/2013 | Bibl et al. | |
| 8,794,501 B2 | 8/2014 | Bibl et al. | |
| 8,809,875 B2 * | 8/2014 | Bibl | H01L 33/28 |
| | | | 257/E33.056 |
| 10,297,712 B2 | 5/2019 | Bibl et al. | |
| 10,672,946 B2 | 6/2020 | Cho et al. | |
| 11,114,582 B2 | 9/2021 | Cho et al. | |
| 12,040,425 B2 | 7/2024 | Cho et al. | |
| 12,243,955 B2 | 3/2025 | Bibl et al. | |
| 2013/0126891 A1 * | 5/2013 | Bibl | H01L 27/15 |
| | | | 257/E33.025 |
| 2017/0130906 A1 * | 5/2017 | Jiang | F21V 3/02 |
| 2017/0170360 A1 * | 6/2017 | Bour | H01L 33/145 |
| 2017/0317228 A1 * | 11/2017 | Sung | H10H 20/84 |
| 2018/0019369 A1 * | 1/2018 | Cho | H01L 33/32 |
| 2018/0175009 A1 * | 6/2018 | Kim | H05K 5/10 |
| 2021/0242380 A1 * | 8/2021 | Kim | H10H 20/833 |
| 2022/0320381 A1 * | 10/2022 | Yoo | H10H 20/8511 |

FOREIGN PATENT DOCUMENTS

| | | | | |
|---|---|---|---|---|
| KR | 10-2018-0007376 A | 1/2018 | | |
| KR | 10-2018-0009014 | 1/2018 | | |
| KR | 10-2020-0063399 | 6/2020 | | |
| WO | WO-2019208880 A1 * | 10/2019 | | H10D 86/451 |
| WO | 2020/157149 A1 | 8/2020 | | |

* cited by examiner

NDA

10

DPA

PAL

DR3

DR2 ⊗ → DR1

210    370   320   380    330   310   220

ED

300: 310, 320, 330, 370

DISPLAY DEVICE HAVING TRUNCATED CONE SHAPED LIGHT EMITTING ELEMENT

CROSS-REFERENCE TO RELATED APPLICATION(S)

This application claims priority to and benefits of from Korean Patent Application No. 10-2020-0128610 filed on Oct. 6, 2020 in the Korean Intellectual Property Office, and all the benefits accruing therefrom under 35 U.S.C. 119, the entire contents of which are incorporated herein by reference.

BACKGROUND

1. Technical Field

The disclosure relates to a display device.

2. Description of the Related Art

The importance of display devices has steadily increased with the development of multimedia technology. Various types of display devices such as organic light emitting displays (OLEDs), liquid crystal displays (LCDs) and the like have been developed.

A display device is a device for displaying an image, and includes a display panel, such as an organic light emitting display panel or a liquid crystal display panel. The light emitting display panel may include light emitting elements such as light emitting diodes (LEDs), and examples of light emitting diodes include an organic light emitting diodes (OLEDs) using an organic material as a light emitting material and inorganic light emitting diodes using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having improved light emission efficiency.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first electrode and a second electrode spaced apart from each other and disposed on a substrate, a light emitting element which may extend in a first direction, and may include a first end disposed on the first electrode in the first direction, and a second end disposed on the second electrode in the first direction. A diameter of the first end of the light emitting element may be different from a diameter of the second end of the light emitting element. The light emitting element may include a first semiconductor layer, a second semiconductor layer spaced apart from the first semiconductor layer, and an active layer disposed between the first semiconductor layer and the second semiconductor layer. The active layer may be adjacent to one of the first end and the second end of the light emitting element, which may have a larger diameter than a diameter of the other.

In an embodiment, the diameter of the second end of the light emitting element may be greater than the diameter of the first end of the light emitting element, and at least a part of the active layer may be disposed on the second electrode.

In an embodiment, at least a part of the active layer may overlap the second electrode in a thickness direction of the substrate.

In an embodiment, the second electrode may be disposed below the active layer and may completely cover the active layer in the thickness direction of the substrate from below the active layer.

In an embodiment, the second semiconductor layer may be adjacent to the first end of the light emitting element, and the first semiconductor layer may be adjacent to the second end of the light emitting element.

In an embodiment, a thickness of the first semiconductor layer in the first direction may be smaller than a thickness of the second semiconductor layer in the first direction.

In an embodiment, the light emitting element may emit red light having a central wavelength band in a range of about 600 nm to about 750 nm.

In an embodiment, each of the first semiconductor layer and the second semiconductor layer may include phosphorus (P).

In an embodiment, a minimum diameter of the first semiconductor layer may be greater than a maximum diameter of the second semiconductor layer.

In an embodiment, a diameter of the active layer may decrease from the first semiconductor layer to the second semiconductor layer.

In an embodiment, the light emitting element may include a first surface which may be a surface of the first end of the light emitting element, a second surface which may be a surface of the second end of the light emitting element, and a third surface which may connect the first surface and the second surface. A first distance in the first direction between the first surface and a surface of the active layer facing the first surface may be greater than a second distance in the first direction between the second surface and another surface of the active layer facing the second surface.

In an embodiment, the light emitting element may have a trapezoidal shape in a cross-sectional view taken in the first direction.

In an embodiment, a diameter of the light emitting element may decrease in the first direction.

In an embodiment, the first semiconductor layer, the active layer, and the second semiconductor layer may be sequentially disposed in the first direction.

In an embodiment, the display device may include an insulating layer disposed on the light emitting element. The insulating layer may expose the first end of the light emitting element and the second end of the light emitting element, and the insulating layer may not overlap at least a part of the active layer in a thickness direction of the substrate.

In an embodiment, the active layer may include a first region overlapping the insulating layer and a second region not overlapping the first insulating layer in the thickness direction of the substrate. A thickness of the first region in the first direction may be smaller than a thickness of the second region in the first direction.

In an embodiment, the active layer does not overlap the insulating layer in the thickness direction of the substrate.

In an embodiment, the display device may include a first contact electrode that may electrically contact the first end of the light emitting element and the first electrode, and a second contact electrode that may electrically contact the second end of the light emitting element and the second electrode. The first contact electrode and the second contact electrode may be electrically disconnected from each other.

In an embodiment, the first end of the light emitting element and the second end of the light emitting element may be inclined with respect to the substrate.

In an embodiment, the first end of the light emitting element and the second end of the light emitting element may be inclined in a same direction toward the substrate.

The display device according to an embodiment may include a light emitting element that has a trapezoidal cross-sectional shape of which the ends may have different diameters from each other, and may include a first semiconductor layer, a second semiconductor layer, and an active layer that may light. By arranging the active layer of the light emitting element to be adjacent to an end which may have a larger diameter than a diameter of the other end, the volume of the active layer may increase, and thus the light output of the light emitting element may increase.

By arranging the active layer to be adjacent to the end having a larger diameter, electrodes provided below the light emitting element and the active layer may be disposed to overlap in a display direction. By arranging the active layer to overlap the electrodes, among light emitted from the active layer and traveling downward, the ratio of light traveling toward the electrode, and thus reflected by the electrode increases. The light reflected by the electrode is emitted in the display direction, thereby improving the light emission efficiency of the display device.

By arranging the active layer to be adjacent to the end having a larger diameter, an insulating layer provided on the light emitting element to fix the light emitting element may be disposed to avoid overlapping the active layer in the display direction. The insulating layer may reduce the transmission of light emitted from the active layer due to the difference in the refractive index. By arranging the active layer to avoid overlapping the insulating layer, the ratio of light emitted from the active layer and then incident on the insulating layer is reduced, which may improve the light emission efficiency of the display device. By forming a first contact electrode and a second contact electrode through the same process using a sacrificial pattern, the number of masks may be reduced, which may improve the process efficiency of the display device.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 4 is a schematic diagram of a light emitting element according to an embodiment;

FIG. 5 is a schematic side view illustrating an example of the light emitting element of FIG. 4;

4

Figure 2:
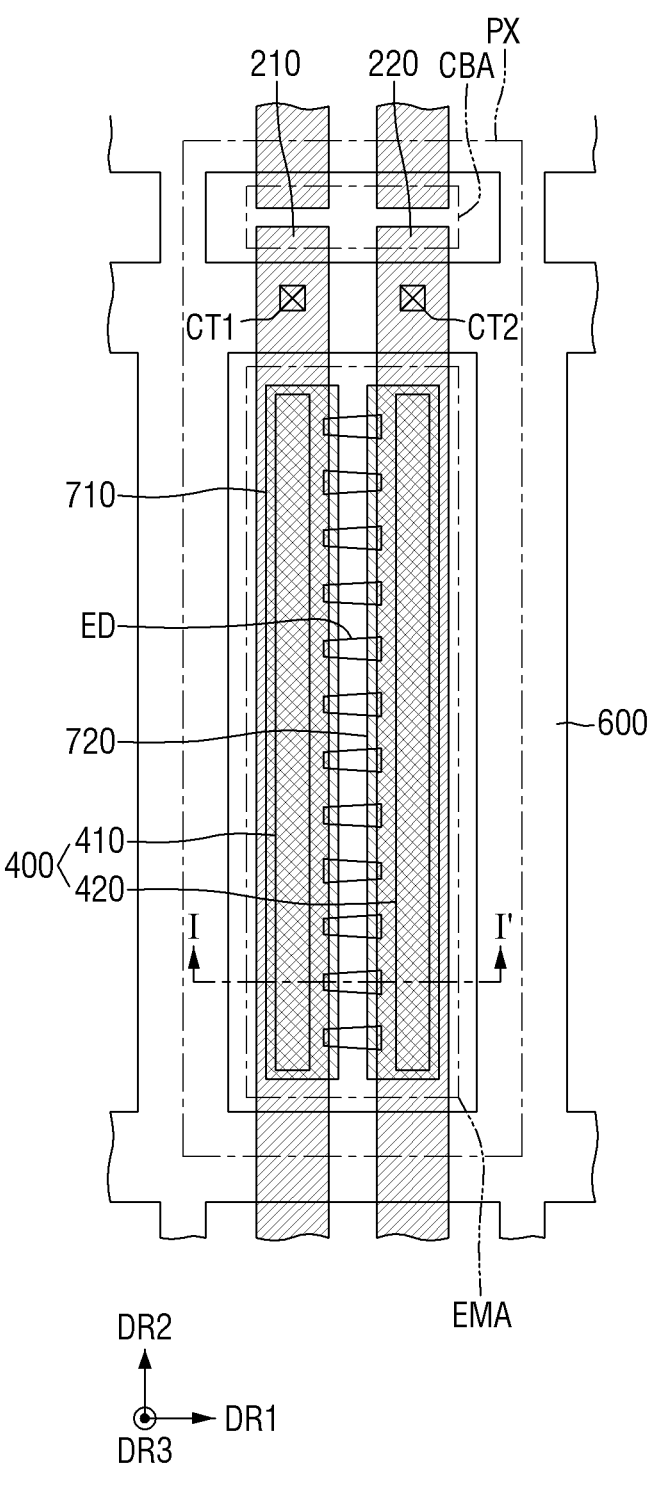
FIG. 2 is a schematic plan view illustrating one pixel of a display device according to an embodiment.
Figure 3:
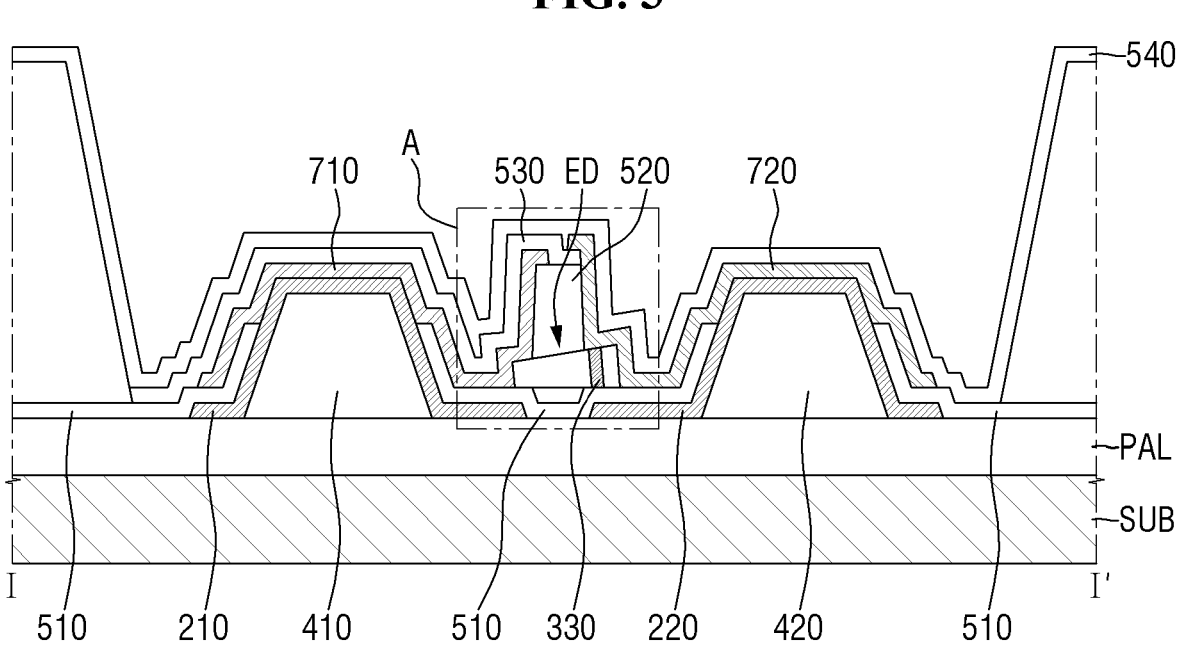
FIG. 3 is a cross-sectional view illustrating an example taken along line I-I' of FIG. 2.
Figure 3:
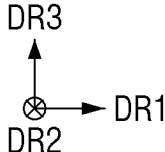
Figure 6:
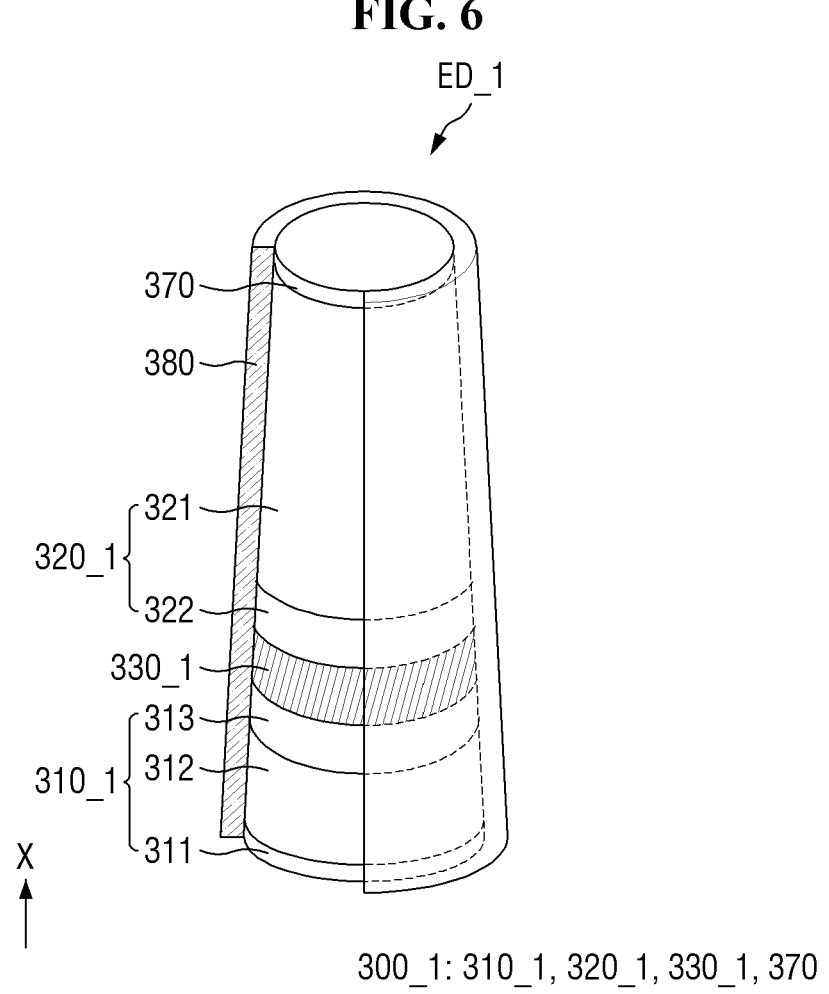
Figure 7:
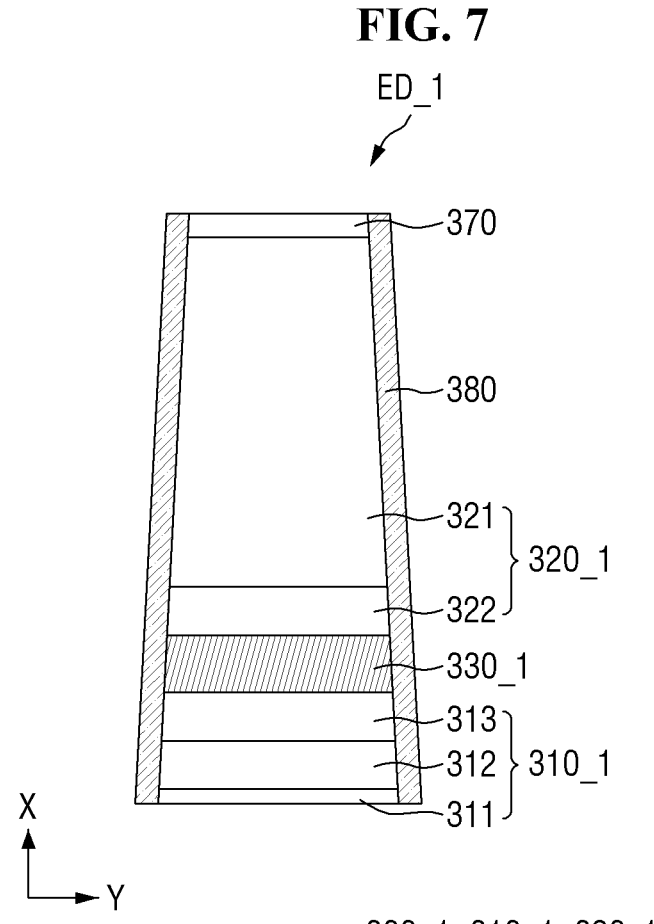
Figure 9:
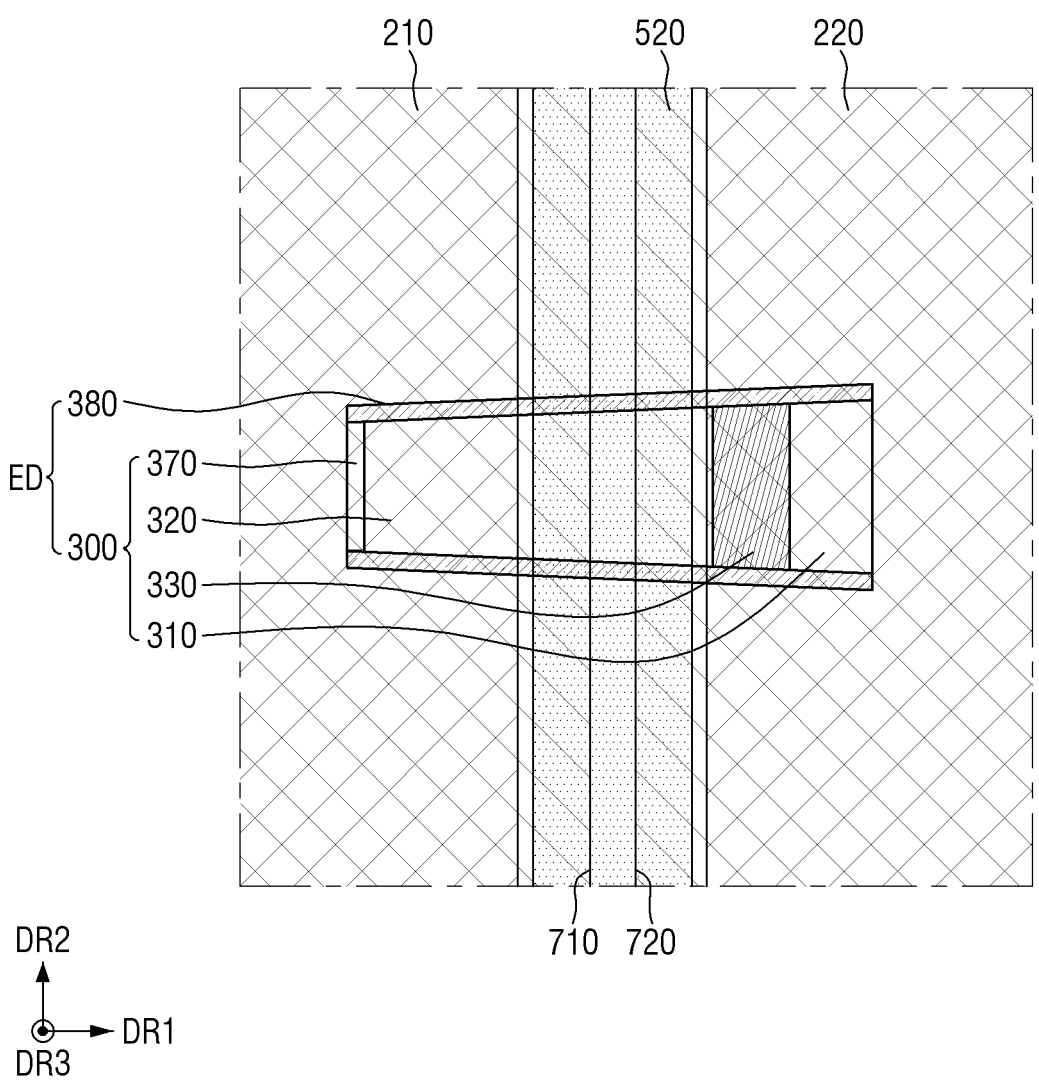
Figure 10:
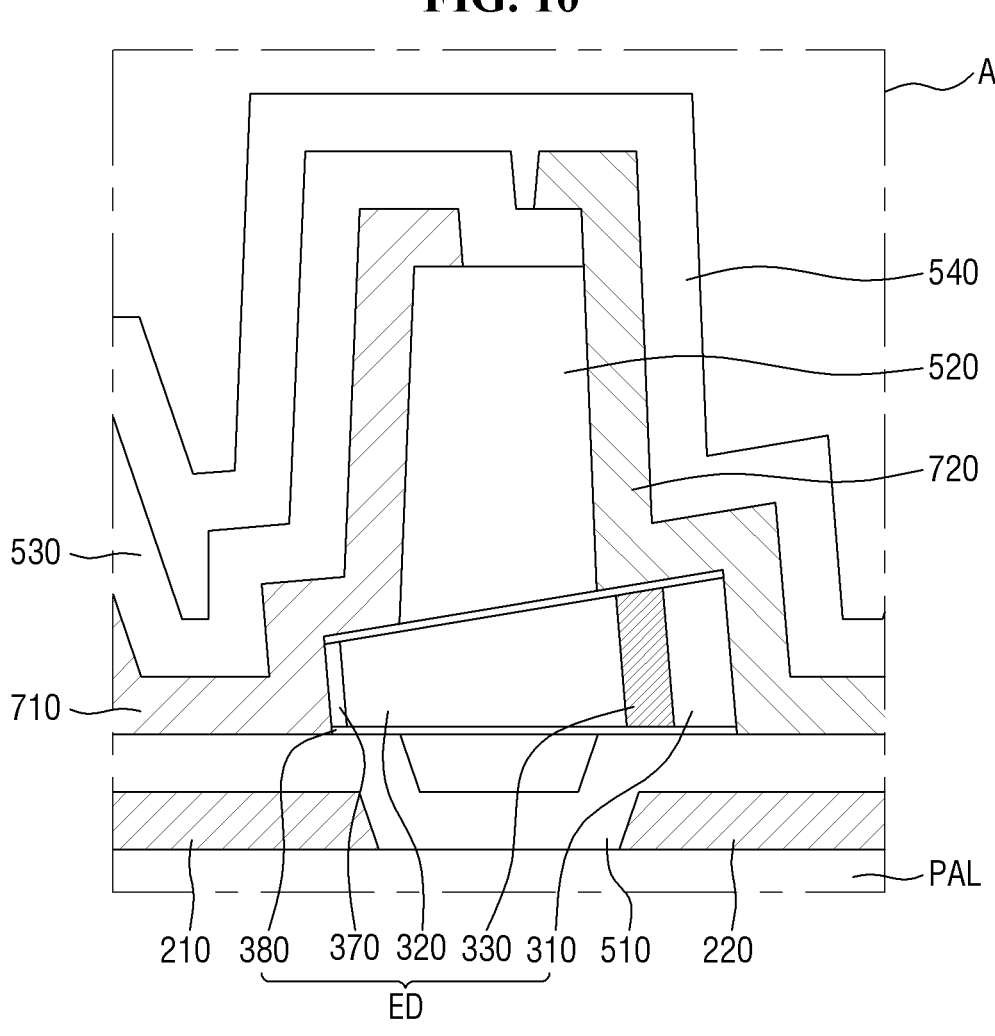
Figure 10:
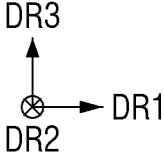
Figure 12:
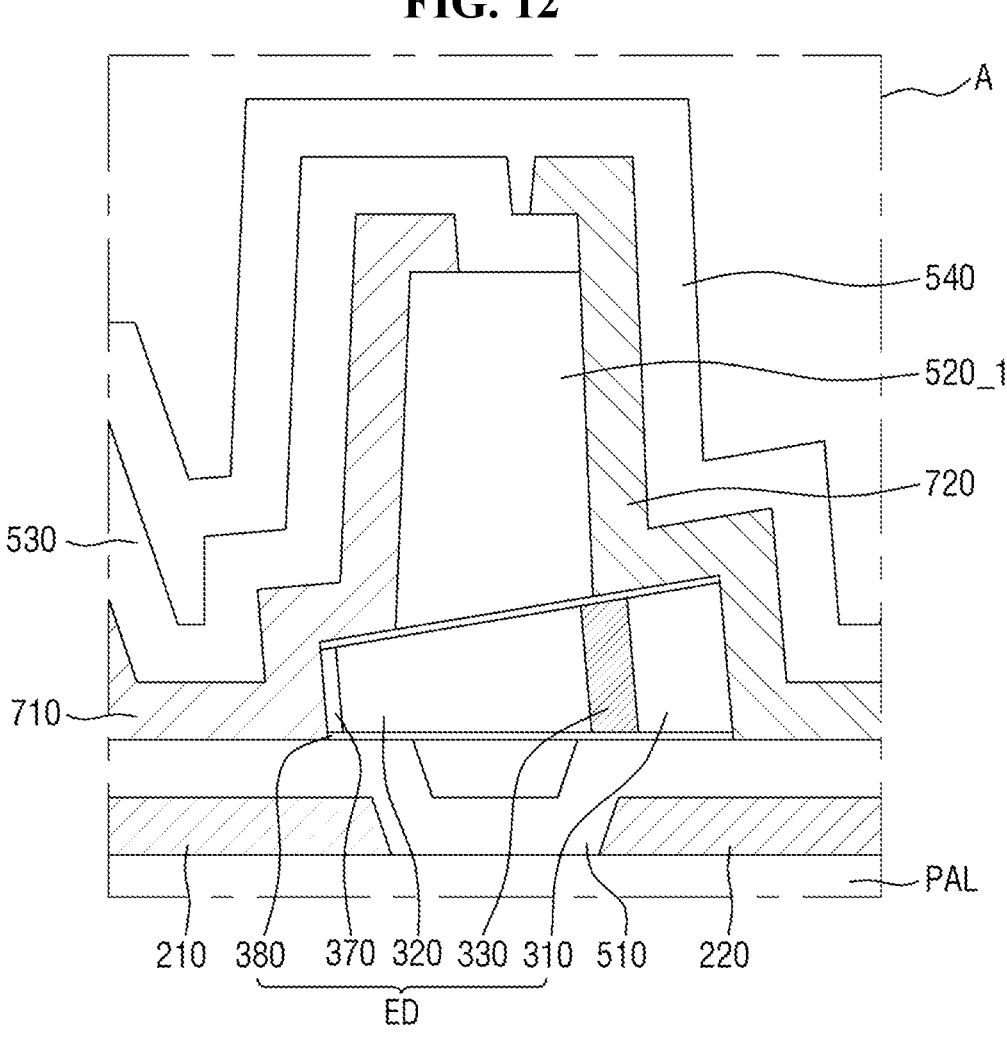
Figure 12:
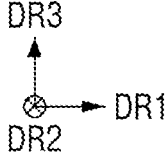
Figure 13:
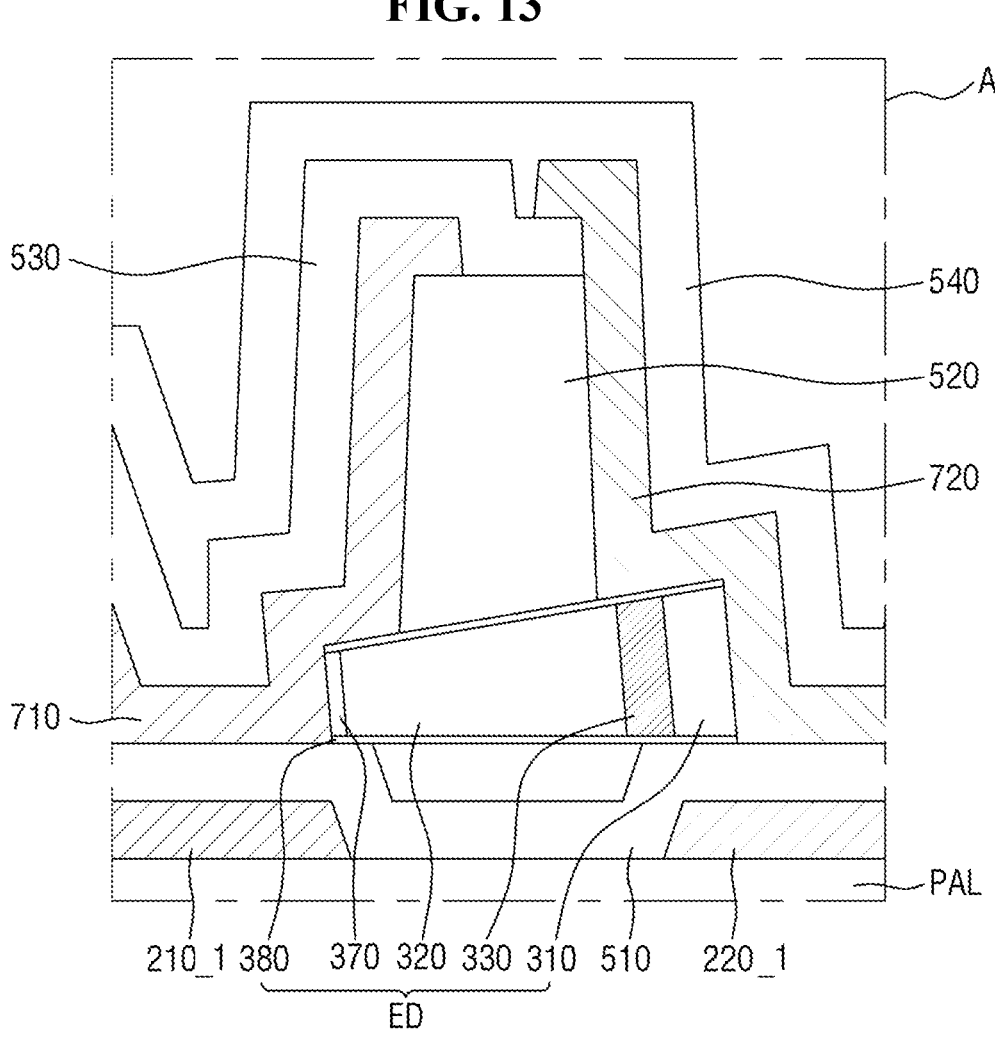
Figure 13:
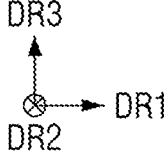
Figure 14:
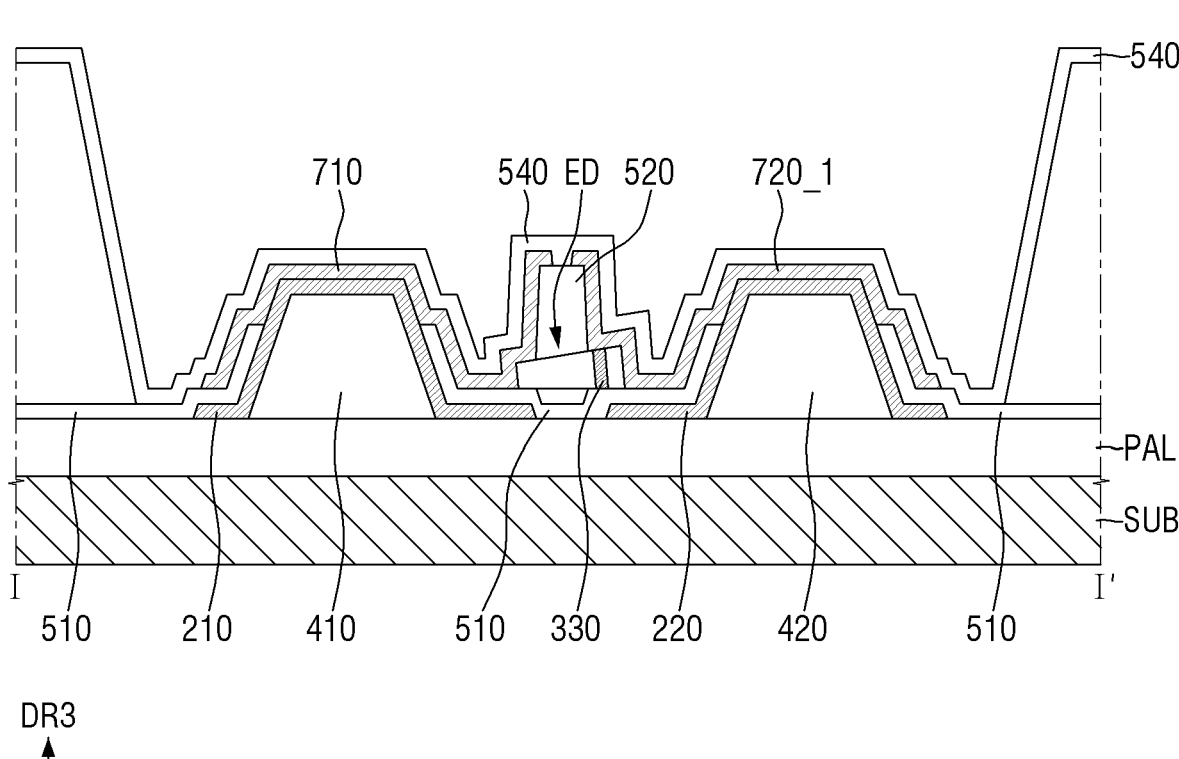
Figure 14:
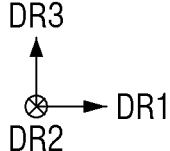

FIG. 6 is a schematic diagram of a light emitting element according to another embodiment;

FIG. 7 is a schematic side view illustrating an example of the light emitting element of FIG. 6;

Figure 8:
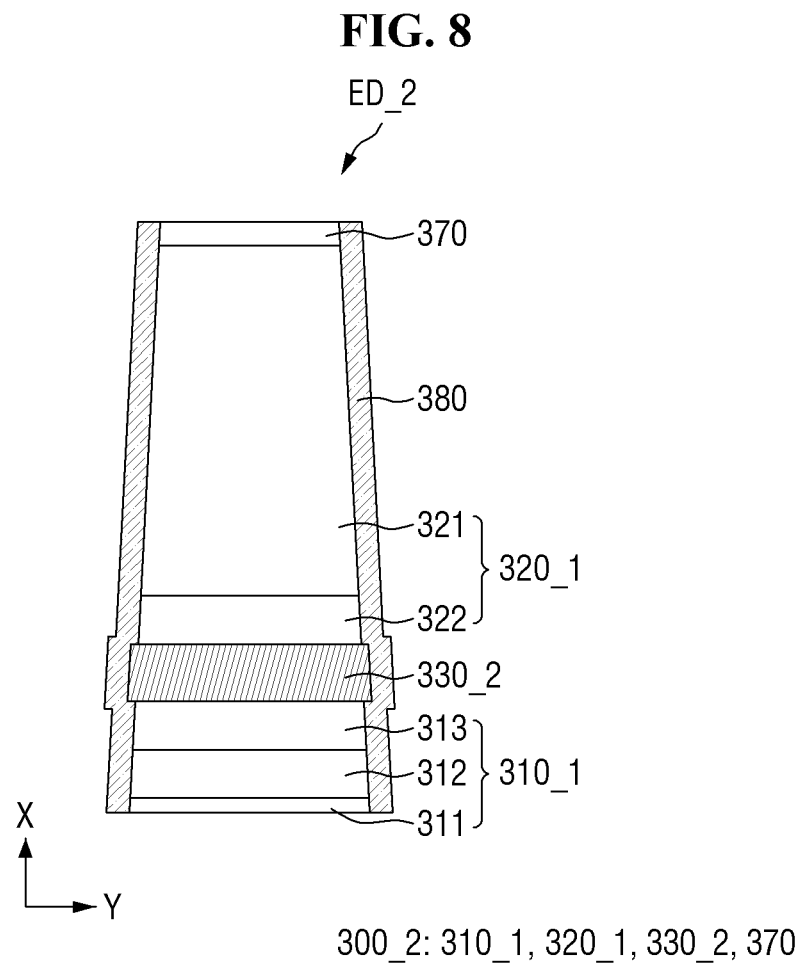

FIG. 8 is a schematic side view showing another example of the light emitting element of FIG. 6;

FIG. 9 is a schematic plan layout view showing a relative planar arrangement of first and second electrodes, first and second contact electrodes, a light emitting element, and a second insulating layer;

FIG. 10 is an enlarged schematic cross-sectional view illustrating an example of area A of FIG. 3;

Figure 11:
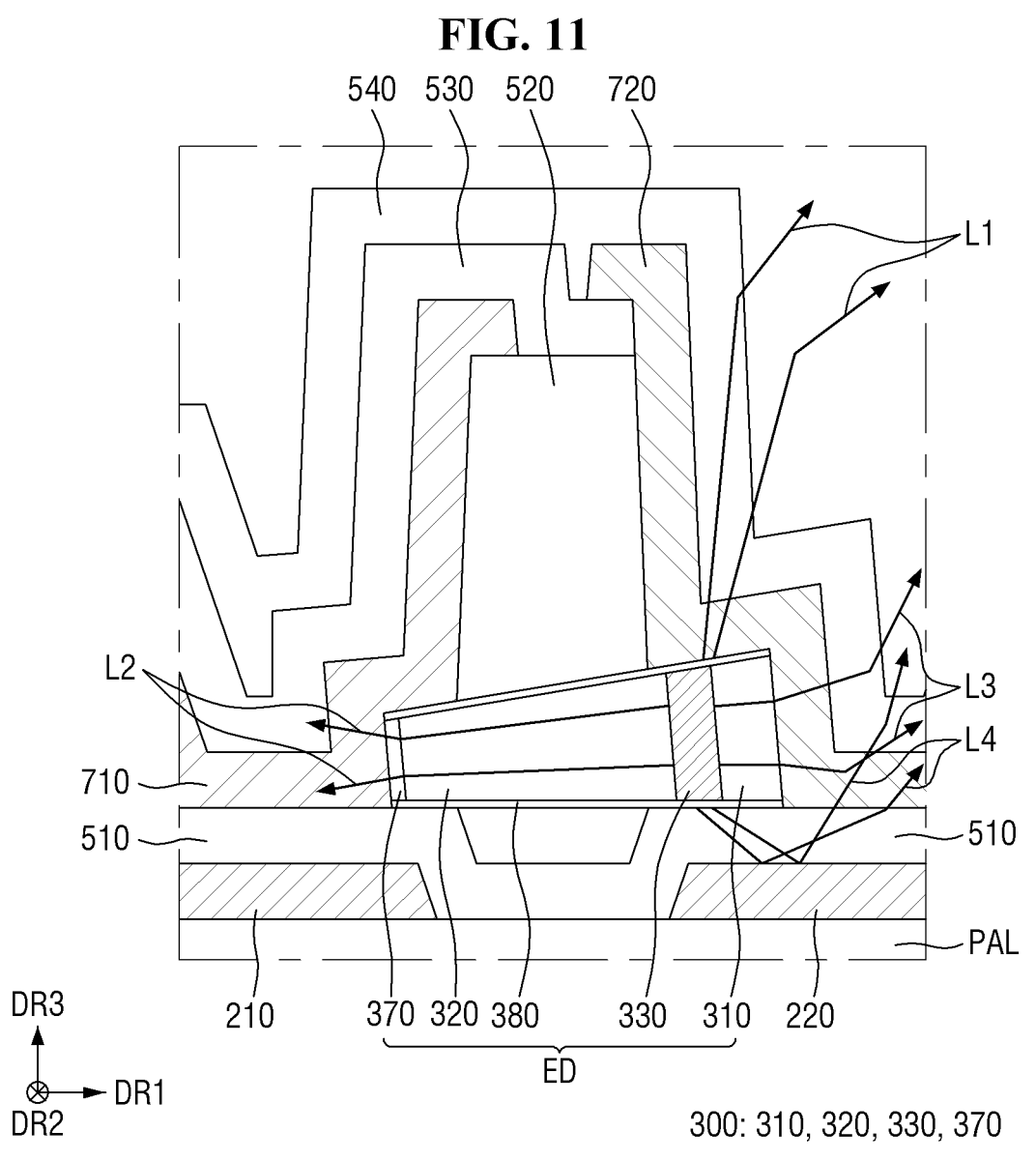

FIG. 11 is an enlarged schematic cross-sectional view showing a traveling direction of light emitted from a light emitting element;

FIG. 12 is an enlarged schematic cross-sectional view illustrating another example of area A of FIG. 3;

FIG. 13 is an enlarged schematic cross-sectional view illustrating still another example of area A of FIG. 3; and FIG. 14 is a schematic cross-sectional view illustrating another example taken along line I-I' of FIG. 2.

DETAILED DESCRIPTION OF THE
EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

The spatially relative terms "below", "beneath", "lower", "above", "upper", "adjacent to" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 1:
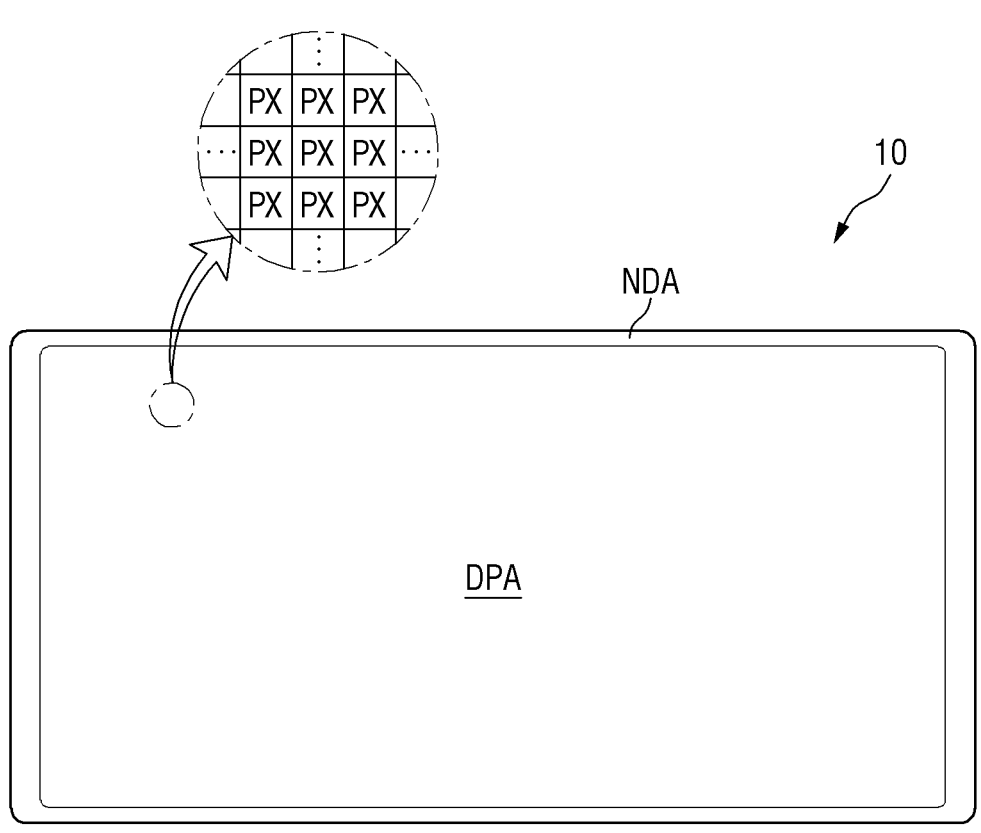
FIG. 1 is a schematic plan view of a display device according to an embodiment.
Figure 1:
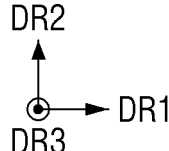

FIG. 1 is a schematic plan view of a display device according to an embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel, and a field emission display panel. An inorganic light emitting diode display panel is described as an example, but the embodiments are not limited thereto, and may apply to other display panels without departing from the scope of the disclosure.

Hereinafter, a first direction DR1, a second direction DR2, and a third direction DR3 are defined in drawings of an embodiment describing the display device 10. The first direction DR1 and the second direction DR2 may be directions perpendicular to each other in a plane. The third direction DR3 may be a direction perpendicular to the plane defined by the first direction DR1 and the second direction DR2. The third direction DR3 is perpendicular to each of the first direction DR1 and the second direction DR2. In an embodiment, the third direction DR3 indicates a thickness direction (or display direction) of the display device 10.

The display device 10 may have a rectangular shape including long and short sides such that the side in the first direction DR1 is longer than the side in the second direction DR2 in a plan view. A corner portion where the long side and the short side of the display device 10 meet may be right-angled in a plan view. However, the embodiments are not limited thereto, and it may be rounded to have a curved shape. The shape of the display device 10 is not limited to the shape illustrated and may be modified. For example, the display device 10 may have other shapes such as a square shape, a quadrilateral shape with rounded corners (vertices), other polygonal shapes and a circular shape in a plan view.

A display surface of the display device 10 may be disposed on a side of the display device 10 in a third direction DR3 which is the thickness direction. In the embodiments, unless otherwise noted, the term "upward" refers to the third direction DR3, which is the display direction, and the term "top surface" refers to the top-side surface of the display device 10 in the third direction DR3. The term "downward" refers to the opposite direction from the third direction DR3, which is the opposite direction to the display direction, and the term "bottom surface" refers to a bottom-side surface on the other side of the top surface. Furthermore, "left", "right", "upper" and "lower" indicate directions when the display device 10 is viewed from above. For example, "right side" indicates a side of the display device 10 in the first direction DR1, and "left side" indicates an opposing side in the opposite of the first direction DR1, "upper side" indicates a side of the second direction DR2, and "lower side" indicates an opposing side in the opposite of the second direction DR2.

The display device 10 may include the display area DPA and a non-display area NDA. The display area DPA is an area where a screen can be displayed, and the non-display area NDA is an area where a screen is not displayed.

The shape of the display area DPA may follow the shape of the display device 10. For example, the shape of the display area DPA may have a rectangular shape similar to the overall shape of the display device 10 in a plan view. The display area DPA may substantially occupy the center of the display device 10.

The display area DPA may include pixels PX. The pixels PX may be arranged in a matrix. The shape of each pixel PX may be a rectangular or square shape in a plan view. In an embodiment, each pixel PX may include light emitting elements made of inorganic particles.

The non-display area NDA may be disposed around the display area DPA. The non-display area NDA may completely or partially surround the display area DPA. The non-display area NDA may form a bezel of the display device 10.

FIG. 2 is a schematic plan view illustrating a pixel of a display device according to an embodiment. FIG. 3 is a schematic cross-sectional view illustrating an example taken along line I-I' of FIG. 2.

Referring to FIG. 2, each pixel PX of the display device 10 may include an emission area EMA and a non-emission area. The emission area EMA may be defined as an area in which light emitted from a light emitting element ED is emitted, and the non-emission area may be defined as an area in which light is not emitted because the light emitted from the light emitting element ED does not reach.

The emission area EMA may include an area in which the light emitting element ED is disposed and an area adjacent thereto. The emission area may further include a region in which the light emitted from the light emitting element ED is reflected or refracted by another member and emitted.

Each pixel PX may further include a first region CBA disposed in the non-emission area. The first region CBA may be disposed at the upper side (or one side in the second direction DR2) from the emission area EMA within a pixel PX. The first region CBA may be disposed between the emission areas EMA of the pixels PX disposed adjacent to each other in the second direction DR2.

The first region CBA may be a region in which electrodes 210 and 220 included in each of the pixels PX adjacent to each other along the second direction DR2 are separated. The electrodes 210 and 220 provided in each pixel PX are separated in the first region CBA, and a part of the electrodes 210 and 220 provided in each pixel PX may be disposed in the first region CBA. The light emitting element ED may not be provided in the first region CBA.

Referring to FIGS. 2 and 3, the display device 10 may include a substrate SUB, a circuit element layer PAL disposed on the substrate SUB, and a light emitting element layer disposed on the circuit element layer PAL. The light emitting element layer may include a first bank 400, first and second electrodes 210 and 220, a second bank 600, the light emitting element ED, first and second contact electrodes 710 and 720, and insulating layers 510, 520, 530, and 540.

The substrate SUB may be an insulating substrate. The substrate SUB may be made of an insulating material such as glass, quartz, or polymer resin. The substrate SUB may be a rigid substrate, but may also be a flexible substrate which can be bent, folded, or rolled.

The circuit element layer PAL may be disposed on the substrate SUB. The circuit element layer PAL may include at least one transistor and the like to drive the light emitting element layer.

The first bank 400 may be disposed on the circuit element layer PAL. Although not shown in the drawings, the circuit element layer PAL may include a via layer, and the first bank 400 may be disposed on the via layer of the circuit element layer PAL.

The first bank 400 may have a shape extending in the second direction DR2 within each pixel PX in a plan view. The first bank 400 may include a first sub-bank 410 and a second sub-bank 420 spaced apart from each other. The space between the first sub-bank 410 and the second sub-bank 420 spaced apart from each other may provide a region in which the light emitting elements ED are disposed.

The first and second sub-banks 410 and 420 may each have a structure in which at least a part thereof protrudes from the top surface of the substrate SUB. The protruding parts of the first and second sub-banks 410 and 420 may have inclined side surfaces. Since the first and second sub-banks 410 and 420 include the inclined side surfaces, the traveling direction of light emitted from the light emitting element ED towards the side surfaces of the first and second sub-banks 410 and 420 may be changed to an upward direction (e.g., the display direction).

The first electrode 210 may be disposed on the first sub-bank 410. The first electrode 210 may extend in the second direction DR2 in a plan view and may overlap a part of the second bank 600 extending in the first direction DR1. The first electrode 210 may be electrically connected to the circuit element layer PAL through a first contact hole CT1.

The first electrode 210 may be disposed to cover the top surface and the inclined side surface of the first sub-bank 410. The first electrode 210 may be disposed on the first sub-bank 410 to cover the first sub-bank 410 in the third direction DR3 (or the thickness direction of the substrate SUB).

The second electrode 220 may be disposed on the second sub-bank 420. The second electrode 220 may be disposed to be spaced apart from the first electrode 210. The second electrode 220 may extend in the second direction DR2 in a plan view and may overlap a part of the second bank 600 extending in the first direction DR1. The second electrode 220 may be electrically connected to the circuit element layer PAL through a second contact hole CT2.

The second electrode 220 may be disposed to cover the top surface and the inclined side surface of the second sub-bank 420. The second electrode 220 may be disposed on the second sub-bank 420 to cover the second sub-bank 420 in the third direction DR3 (or the thickness direction of the substrate SUB).

The first electrode 210 and the second electrode 220 may extend outward on the first sub-bank 410 and the second sub-bank 420, respectively, and may be partially disposed even in the space between the first sub-bank 410 and the second sub-bank 420 spaced apart from each other. The first electrode 210 and the second electrode 220 may face each other while being spaced apart from each other in the space between the first sub-bank 410 and the second sub-bank 420 spaced apart from each other.

The first and second electrodes 210 and 220 may be electrically connected to the light emitting elements ED, and may receive a voltage so that the light emitting elements ED emit light. For example, the electrodes 210 and 220 may be electrically connected to the light emitting elements ED arranged between the first sub-bank 410 and the second sub-bank 420 through the contact electrodes 710 and 720 described below. An electrical signal applied to the electrodes 210 and 220 may be transmitted to the light emitting elements ED through the contact electrodes 710 and 720.

Each of the first and second electrodes 210 and 220 may include a conductive material having high reflectivity. For example, each of the first and second electrodes 210 and 220 may include a metal such as silver (Ag), copper (Cu), or aluminum (Al) as a material having high reflectivity, or may be an alloy including aluminum (Al), nickel (Ni), lanthanum (La), and the like. Each of the first and second electrodes 210 and 220 may reflect, in the display direction (e.g., the third direction DR3), light emitted from the light emitting elements ED towards the side surface of the first bank 400.

However, the embodiments are not limited thereto, and each of the first and second electrodes 210 and 220 may further include a transparent conductive material. For example, each of the first and second electrodes 210 and 220 may include a material such as ITO, IZO, and ITZO. In some embodiments, each of the first and second electrodes 210 and 220 may have a structure in which at least one transparent conductive material and at least one metal layer having high reflectivity are stacked, or may be formed as a single layer including both materials. For example, each of the first and second electrodes 210 and 220 may have a stacked structure such as ITO/Ag/ITO, ITO/Ag/IZO, or ITO/Ag/ITZO/IZO.

A first insulating layer 510 is disposed on the electrodes 210 and 220 and the first bank 400. The first insulating layer 510 may be disposed on the first electrode 210 and the second electrode 220 and may expose at least a part of the first electrode 210 and the second electrode 220.

In an embodiment, openings may be formed in the first insulating layer 510 to expose a part of the top surface of the first electrode 210 disposed on the first sub-bank 410 and a part of the top surface of the second electrode 220 disposed on the second sub-bank 420. The first contact electrode 710 described below may electrically contact the first electrode 210 through the opening penetrating the first insulating layer 510, and the second contact electrode 720 may electrically contact the second electrode 220 through the opening penetrating the first insulating layer 510.

The first insulating layer 510 may protect the first electrode 210 and the second electrode 220 and insulate them from each other. The first insulating layer 510 may include a region between the first electrode 210 and the second electrode 220 and may be disposed on the first electrode 210 and the second electrode 220 to insulate them from each other. It is possible to prevent the light emitting element ED disposed on the first insulating layer 510 from being damaged by direct contact with other members.

The second bank 600 is disposed on the first insulating layer 510. The second bank 600 may be disposed in the form of a grid pattern including portions extending in the first and second directions DR1 and DR2 in a plan view. The second bank 600 may be formed to have a height greater than that of the first bank 400. The second bank 600 may perform a function of preventing an ink including the light emitting elements ED from overflowing to adjacent pixels PX during an inkjet printing process for aligning the light emitting elements ED in the manufacturing process of the display device 10.

The light emitting element ED may have a shape extending in a direction. One end of the light emitting element ED may have a different diameter than the other end of the light emitting element ED in the extension direction. The light emitting element ED may include an active layer 330 and emit light of a specific wavelength band according to an electric signal applied through the first electrode 210 and the second electrode 220. The active layer 330 of the light emitting element ED may be positioned adjacent to an end having a larger diameter of both ends of the light emitting element ED. A detailed description of the shape of the light emitting element ED will be given later with reference to other drawings.

The light emitting element ED may be disposed on the first insulating layer 510 between the first sub-bank 410 and the second sub-bank 420. The light emitting element ED may be disposed on the first insulating layer 510 so that the ends of the light emitting element ED in the extension direction are disposed on the first electrode 210 and the second electrode 220, respectively. The extension direction of the light emitting elements ED may be substantially perpendicular to the extension direction of the electrodes 210 and 220. However, the disclosure is not limited thereto. Some of the light emitting elements ED may be arranged such that the extension direction thereof is substantially perpendicular to the extension direction of the first and second electrodes 210 and 220, and the extension direction of other light emitting elements ED may be oblique to the extension direction of the first and second electrodes 210 and 220.

A second insulating layer 520 may be partially disposed on the light emitting element ED. The second insulating layer 520 may be disposed to partially surround the outer surface of the light emitting element ED, but not to cover the ends of the light emitting element ED. The second insulating layer 520 may be disposed to expose at least a part of the active layer 330 of the light emitting element ED. The second insulating layer 520 may not overlap at least a part of the active layer 330 in the third direction DR3.

A part of the second insulating layer 520 disposed on the light emitting element ED may be disposed to extend in the second direction DR2 on the first insulating layer 510 in a plan view to form a linear or an island-like pattern within each pixel PX. The second insulating layer 520 may function to protect the light emitting element ED and fix the light emitting element ED in a manufacturing process of the display device 10.

The first contact electrode 710 may be disposed on the first electrode 210. The first contact electrode 710 may have a shape extending in one direction. The first contact electrode 710 may have a shape extending in the second direction DR2. The first contact electrode 710 may form a stripe pattern in the emission area EMA of each pixel PX.

The first contact electrode 710 may contact the first electrode 210 and one end of the light emitting element ED. The first contact electrode 710 may be disposed on the first electrode 210, and a part thereof may contact a surface of the first electrode 210 exposed by the first insulating layer 510 and another part thereof may contact an end of the light emitting element ED. Since the first contact electrode 710 is in contact with each of the first electrode 210 and an end of the light emitting element ED, it may electrically connect the light emitting element ED to the first electrode 210. The first contact electrode 710 may extend from one end of the light emitting element ED toward the second insulating layer 520 and may also be disposed on a part of the second insulating layer 520.

The second contact electrode 720 may be disposed on the second electrode 220. The second contact electrode 720 may have a shape extending in one direction. The second contact electrode 720 may have a shape extending in the second direction DR2. The second contact electrode 720 may form a stripe pattern in the emission area EMA of each pixel PX. The second contact electrode 720 may be disposed to face the first contact electrode 710 while being spaced apart from the first contact electrode 710 in the first direction DR1.

The second contact electrode 720 may contact the second electrode 220 and the other end of the light emitting element ED. The second contact electrode 720 may be disposed on the second electrode 220, and a part thereof may contact a surface of the second electrode 220 exposed by the first insulating layer 510 and another part thereof may contact the other end of the light emitting element ED. Since the second contact electrode 720 is in contact with each of the second electrode 220 and the other end of the light emitting element ED, it may electrically connect the light emitting element ED to the second electrode 220. The second contact electrode 720 may extend from the other end of the light emitting element ED toward a third insulating layer 530 described below, and may also be disposed on a part of the third insulating layer 530.

Each of the first and second contact electrodes 710 and 720 may include a conductive material. For example, it may include ITO, IZO, ITZO, aluminum (Al), or the like. As an example, the first and second contact electrodes 710 and 720 may each include a transparent conductive material, but the embodiments are not limited thereto.

The third insulating layer 530 is disposed on the first contact electrode 710. The third insulating layer 530 may be disposed to cover the first contact electrode 710. An end surface of the third insulating layer 530 and the second insulating layer 520 facing the second sub-bank 420 may be aligned with each other.

The third insulating layer 530 may electrically insulate the first contact electrode 710 and the second contact electrode 720 from each other. The first contact electrode 710 and the second contact electrode 720 may be electrically disconnected from each other. The third insulating layer 530 may be disposed to cover the first contact electrode 710, but may not be disposed on the other end of the light emitting element ED such that the light emitting element ED may contact the second contact electrode 720.

The first contact electrode 710 and the second contact electrode 720 may be disposed on different layers. A part of the first contact electrode 710 may be directly disposed on the second insulating layer 520 disposed on the light emitting element ED, and a part of the second contact electrode 720 may be directly disposed on the third insulating layer 530, so that the third insulating layer 530 may be interposed between the first contact electrode 710 and the second contact electrode 720.

A fourth insulating layer 540 may be entirely disposed on the substrate SUB. The fourth insulating layer 540 may function to protect the members disposed on the substrate SUB against the external environment.

Figure 4:
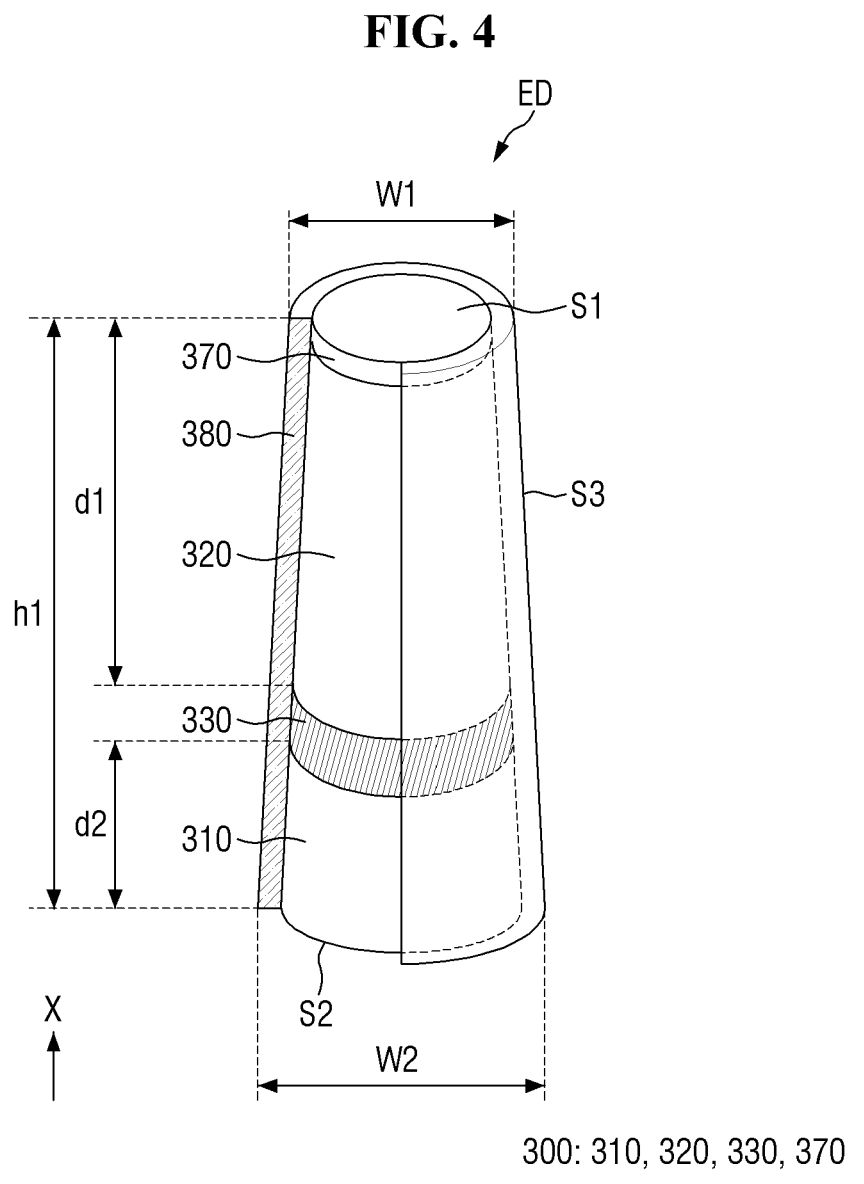
Figure 5:
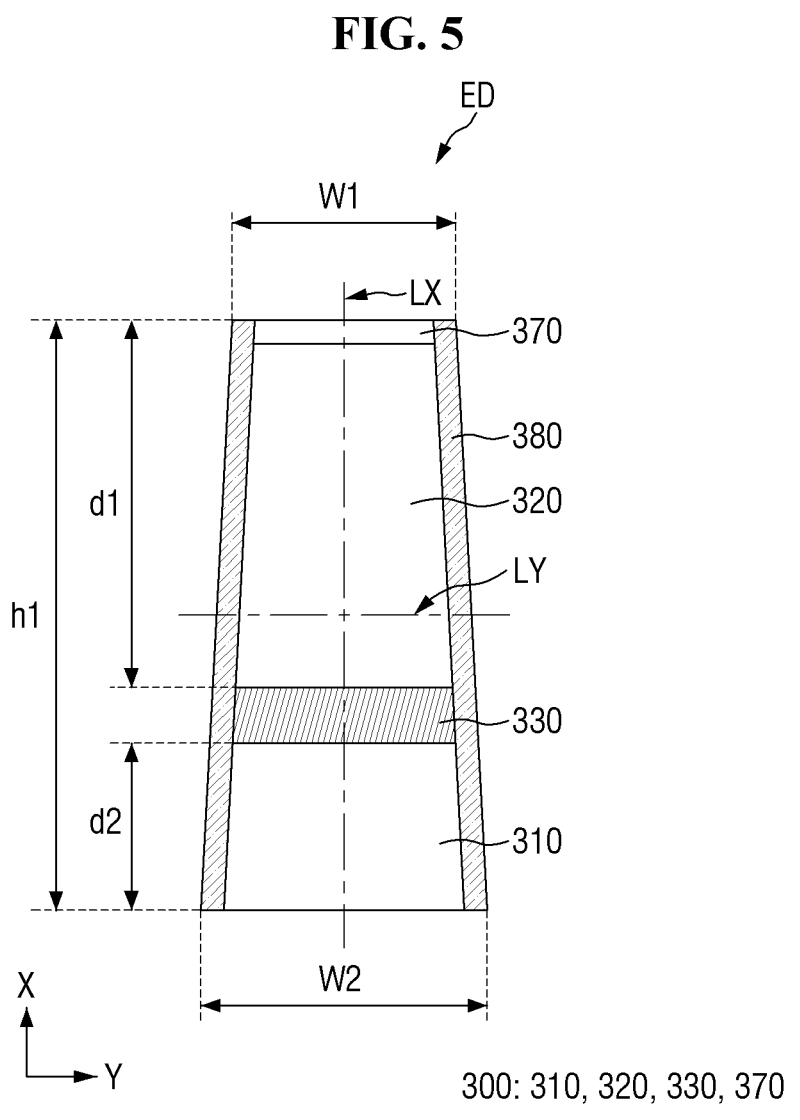

FIG. 4 is a schematic diagram of a light emitting element according to an embodiment. FIG. 5 is a schematic side view illustrating an example of the light emitting element of FIG. 4. FIG. 5 is a schematic cross-sectional view of the light emitting element ED taken along in direction X, which is an extension direction of the light emitting element ED.

Referring to FIG. 4, the light emitting element ED is a particle type element, and may have a shape extending in direction X. The light emitting element ED may have a column shape, a rod shape, or a frustrum shape. In an embodiment, the light emitting element ED may have a truncated cone shape or a polygonal pyramid shape. The length of the light emitting element ED may be larger than the diameter of the light emitting element ED, and the aspect ratio may be in a range of about 6:5 to about 100:1, but the embodiments are not limited thereto.

The light emitting element ED may have a size of a nanometer scale (equal to or greater than about 1 nm and less than about 1 μm) to a micrometer scale (equal to or greater than about 1 μm and less than about 1 mm). In an embodiment, both the diameter and the length of the light emitting element ED may be on a nanometer scale, or on a micrometer scale. In other embodiments, the diameter of the light emitting element ED may be on a nanometer scale, while the length of the light emitting element ED may be on a micrometer scale. In some embodiments, some of the light emitting elements ED have a diameter and/or length on a nanometer scale, while some others of the light emitting elements ED have a diameter and/or length on a micrometer scale.

In an embodiment, the light emitting element ED may be an inorganic light emitting diode. The light emitting element ED may include a semiconductor layer doped with any conductivity type (e.g., p-type or n-type) impurities. The semiconductor layer may emit light of a specific wavelength band by receiving an electrical signal applied from an external power source.

The light emitting element ED may have a shape that may extend in direction X and changes in diameter (or width) along direction X. The diameter of the light emitting element ED may increase or decrease along direction X. In an embodiment, the light emitting element ED may have a shape in which its diameter decreases along direction X. Since the light emitting element ED may have a shape in which its diameter (or width) decreases along direction X, the diameters (or widths) of each of the ends of the light emitting element ED in direction X may be different from each other.

Hereinafter, the direction X and the direction Y are defined in the drawings (refer to FIGS. 5, 7 and 8) describing the cross-sectional shape of the light emitting element ED. The one direction X may be the extension direction of the light emitting element ED, and the other direction Y may be a direction perpendicularly intersecting with the one direction X at the center of the light emitting element ED.

Hereinafter, in embodiments describing the light emitting element ED, unless otherwise stated, "upper portion" refers to a side in the direction X, which is the extension direction of the light emitting element ED, son which a second semiconductor layer 320 (described below) is disposed with respect to the active layer 330, and "top surface" refers to the surface toward the upper portion in the direction X. The "lower portion" refers to the other side from the upper portion in the opposite direction in direction X. The "bottom surface" refers to the surface toward the lower portion in the direction X.

The light emitting element ED may include a first surface S1, a second surface S2, and a third surface S3. The first surface S1 may be an end surface of the light emitting element ED, the second surface S2 may be the other end surface of the light emitting element ED, and the third surface S3 may be a side surface of the light emitting element ED connecting the first surface S1 and the second surface S2 or an outer surface of the light emitting element ED extending in the direction X. Hereinafter, in describing the shape of the light emitting element ED, the first surface S1 may also be referred to the top surface, the second surface S2 to the bottom surface, and the third surface S3 to the side surface.

A first diameter W1 of the first surface S1 of the light emitting element ED may be different from a second diameter W2 of the second surface S2. The second diameter W2 of the second surface S2 may be larger than the first diameter W1 of the first surface S1, and the third surface S3 may have an inclined shape. The third surface S3 may be inclined at an acute angle with respect to the second surface S2. The light emitting element ED may have a truncated cone shape in which the first diameter W1 of the first surface S1, which is the top surface, is smaller than the second diameter W2 of the second surface S2, which is the bottom surface, by forming a taper angle.

The light emitting element ED according to an embodiment may include a light emitting element core 300 extending in direction X. The light emitting element ED may further include an insulating film 380 surrounding the outer surface of the light emitting element core 300.

The light emitting element core 300 may have a shape extending along direction X which is the extension direction of the light emitting element ED. The shape of the light emitting element core 300 may follow the shape of the light emitting element ED. The light emitting element core 300 may extend in the direction X similarly to the shape of the light emitting element ED, and may have a shape in which its diameter (or width) changes along direction X. For example, the light emitting element core 300 may have a truncated cone shape in which the diameter decreases along direction X.

The light emitting element core 300 may include a first semiconductor layer 310, the active layer 330, the second semiconductor layer 320, and an electrode layer 370, which may be sequentially stacked in the direction X.

The first semiconductor layer 310 may be, for example, an n-type semiconductor having a first conductivity type. The first semiconductor layer 310 may be doped with a first conductive dopant. For example, the first conductive dopant may be Si, Ge, Sn, or the like. When the light emitting element ED emits light of a blue or green wavelength band, the first semiconductor layer 310 may include a semiconductor material having a composition ratio of AlxGayIn(1–x–y)N (where 0≤x≤1, 0≤y≤1, and 0≤x+y≤1). In an embodiment, the first semiconductor layer 310 may be n-GaN doped with n-type Si.

The first semiconductor layer 310 may have a shape extending along the direction X. The first semiconductor layer 310 may have a diameter that varies along the direction X. The diameter of the first semiconductor layer 310 may decrease along the direction X. However, the embodiments are not limited thereto, and the diameter of the first semiconductor layer 310 may have a substantially uniform diameter along the direction X. The first semiconductor layer 310 may have a diameter greater than or equal to the maximum diameters of the active layer 330 and the second semiconductor layer 320 described below.

The first semiconductor layer 310 may include a surface facing the active layer 330, another surface, and a side surface. The other surface of the first semiconductor layer 310 may be opposite to the surface facing the active layer 330. In the drawings, the surface of the first semiconductor layer 310 that faces the active layer 330 may be referred to as a top surface and the other surface may be referred to as the bottom surface of the first semiconductor layer 310.

Since the diameter of the first semiconductor layer 310 decreases along the direction X, the diameter of the top surface may be smaller than the diameter of the bottom surface, and the side surface may have an inclined shape. The side surface of the first semiconductor layer 310 may be inclined at an acute angle with respect to the bottom surface of the first semiconductor layer 310. The diameter of the bottom surface of the first semiconductor layer 310 may be in a range of about 800 nm to about 1000 nm but the embodiments are not limited thereto.

The second semiconductor layer 320 may be disposed above the first semiconductor layer 310. The second semiconductor layer 320 may be spaced apart from the first semiconductor layer 310 in the extension direction X of the light emitting element ED.

The second semiconductor layer 320 may be, for example, a p-type semiconductor having a second conductivity type. The second semiconductor layer 320 may be doped with a second conductive dopant. For example, the second conductive dopant may be Mg, Zn, Ca, Se, Ba, or the like. In case that the light emitting element ED emits light of a blue or green wavelength band, the second semiconductor layer 320 may include a semiconductor material having a composition ratio of AlxGayIn(1–x–y)N (where 0≤x≤1, 0≤y≤1, and 0≤x+y≤1). In an embodiment, the second semiconductor layer 320 may be p-GaN doped with p-type Mg.

The second semiconductor layer 320 may have a shape extending along the direction X. The second semiconductor layer 320 may have a diameter that varies along the direction X. The diameter of the second semiconductor layer 320 may decrease along the direction X. However, the embodiments are not limited thereto, and the second semiconductor layer 320 may have a substantially uniform diameter along the direction X.

The second semiconductor layer 320 may include a surface facing the electrode layer 370, another surface, and a side surface. The other surface of the second semiconductor layer 320 may face a surface of the active layer 330. In the drawings, the surface of the second semiconductor layer 320 facing the electrode layer 370 may be referred to as the top surface and the other surface facing the active layer 330 may be referred to as the bottom surface.

Since the diameter of the second semiconductor layer 320 decreases along the one direction X, the diameter of the top surface of the second semiconductor layer 320 may be smaller than the diameter of the bottom surface thereof, and the side surface thereof may have an inclined shape. The side surface of the second semiconductor layer 320 may be inclined at an acute angle with respect to the bottom surface of the second semiconductor layer 320. Although not limited to the following, the diameter of the top surface of the second semiconductor layer 320 may be in a range from about 300 nm to about 400 nm.

The active layer 330 may be disposed between the first semiconductor layer 310 and the second semiconductor layer 320. The active layer 330 may be interposed between the first semiconductor layer 310 and the second semiconductor layer 320. The active layer 330 may include a material having a single or multiple quantum well structure. The active layer 330 may emit light by coupling of electron-hole pairs according to an electrical signal applied through the first semiconductor layer 310 and the second semiconductor layer 320. However, the embodiments are not limited thereto, and the active layer 330 may have a structure in which semiconductor materials having large band gap energy and semiconductor materials having small band gap energy are alternately stacked, and may include other group III to V semiconductor materials according to the wavelength band of the emitted light.

In case that the light emitting element ED emits light of a blue or green wavelength band, the light emitting layer 330 may include a material such as AlGaN or AlGaInN. For example, the light emitting layer 330 may include AlGaInN as a quantum layer and AlInN as a well layer to emit blue light having a central wavelength band ranging from about 450 nm to about 495 nm.

The light emitted from the active layer 330 may be projected through both side surfaces as well as the outer surface of the light emitting element ED in a longitudinal direction. The directionality of the light emitted from the active layer 330 is not limited to one direction.

The active layer 330 may include a surface facing the second semiconductor layer 320, another surface, and a side surface. The other surface of the active layer 330 may be opposite to the surface of the active layer 330 facing the second semiconductor layer 320. In the drawings, the surface of the active layer 330 facing the second semiconductor layer 320 may be referred to as the top surface and the other surface may be referred to as the bottom surface.

The active layer 330 may have a diameter that varies along the direction X. The diameter of the active layer 330 may decrease along the direction X. Since the diameter of the active layer 330 decreases along the direction X, the diameter of the top surface of the active layer 330 may be smaller than the diameter of the bottom surface, and the side surface thereof may have an inclined shape. The side surface of the active layer 330 may be inclined at an acute angle with respect to the bottom surface of the active layer 330. Although not limited to the following, the diameter of the top surface of the active layer 330 may be in a range from about 450 nm to about 500 nm, and the diameter of the bottom surface thereof may be in a range from about 550 nm to about 650 nm.

The light emitted from the active layer 330 may be projected not only through the end surfaces of the light emitting element ED in the extension direction X, but also through the side surfaces. The directionality of the light emitted from the active layer 330 to the outside of the light emitting element ED is not limited to one direction.

The electrode layer 370 may be disposed on the second semiconductor layer 320. The electrode layer 370 may be an ohmic contact electrode. However, the embodiments are not limited thereto, and it may be a Schottky contact electrode.

In case that both ends of the light emitting element ED are electrically connected to the contact electrodes 710 and 720 to apply an electrical signal to the first and second semiconductor layers 310 and 320, the electrode layer 370 may be disposed between the second semiconductor layer 320 and the electrode to reduce resistance. The electrode layer 370 may include a conductive metal. For example, the electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 370 may include an n-type or p-type doped semiconductor material.

An end surface of the light emitting element core 300 may be the top surface of the electrode layer 370 or the second semiconductor layer 320, and the other end surface of the light emitting element core 300 may be the bottom surface of the first semiconductor layer 310. The maximum diameter of one end of the light emitting element core 300 may be larger than the minimum diameter of the other end of the light emitting element core 300. The cross-sectional view of light emitting element core 300 taken in the direction X may have a trapezoidal shape. In an embodiment, the cross-sectional shape of the light emitting element core 300 may include a shape symmetrical with respect to a first reference line Lx which traverses the center of the light emitting element ED in the direction X. The light emitting element core 300 or the light emitting element ED may have an equilateral trapezoidal cross-sectional shape in which both sides are inclined at the same angle. However, the embodiments are not limited thereto. The light emitting element core 300 or the light emitting element ED may have a trapezoidal cross-sectional shape in which both sides are inclined at different angles. In other examples, the light emitting element core 300 or the light emitting element ED may be formed such that the first surface S1 and the second surface S2 are not parallel to each other, and at least one of the first surface S1 and the second surface S2 is inclined with respect to the direction X.

In the light emitting element core 300, the active layer 330 may be adjacent to the end of the light emitting element core 300 which has a larger diameter than a diameter of the other end of the light emitting element core 300. The active layer 330 may include one surface facing the first surface S1 of the light emitting element ED and the other surface facing the second surface S2 of the light emitting element ED. For example, one surface of the active layer 330 may be a top surface, and the other surface thereof may be a bottom surface.

A first distance d1 in the direction X between the first surface S1 of the light emitting element ED and the top surface of the active layer 330 may be different from a second distance d2 in the direction X between the second surface S2 of the light emitting element ED and the bottom surface of the active layer 330. The second diameter W2 of the second surface S2 may be larger than the first diameter W1 of the first surface S1. The first distance d1 may be greater than the second distance d2. Since the active layer 330 is formed such that the first distance d1 is greater than the second distance d2, the active layer 330 may be disposed closer to the end of the light emitting element ED having the larger diameter. The thickness of the first semiconductor layer 310 corresponds to the second distance d2 and the thickness of the second semiconductor layer 320 corresponds to the first distance d1. Thus, the thickness of the first semiconductor layer 310 is smaller than the thickness of the second semiconductor layer 320 in the direction X.

The active layer 330 may be disposed on one side in the direction X with respect to a second reference line Ly which traverses the center of the light emitting element ED in the direction Y perpendicular to the direction X. The active layer 330 may be disposed adjacent to a second end having the second diameter W2 larger than the first diameter W1 with respect to the second reference line Ly.

The insulating film 380 may be disposed to surround the light emitting element core 300. The insulating film 380 may be formed to surround the side surface of each member of the light emitting element core 300 to serve to protect each member, e.g., the first semiconductor layer 310, the second semiconductor layer 320, and the active layer 330, of the light emitting element core 300.

The insulating film 380 is arranged to surround the outer surfaces of the semiconductor layers and electrode layers described above. In an embodiment, the insulating film 380 may be disposed to surround at least the outer surface of the active layer 330 of the light emitting element core 300, and may extend in the direction X which is the extension direction of the light emitting element ED.

The insulating film 380 may have a substantially uniform thickness along the one direction X. The thickness of the insulating film 380 may have the range of about 10 nm to about 1.0 μm, but is not limited thereto. The thickness of the insulating film 380 may be in the range of about 20 nm to about 100 nm.

The insulating film 380 may include materials having insulating properties. For example, it may include silicon oxide (SiOx), silicon nitride (SiNx), silicon oxynitride (SiOxNy), aluminum nitride (AlN), aluminum oxide (AlOx), or the like. The insulating film 380 may have a single layer structure including the above-mentioned materials or a multilayer structure in which the above-mentioned materials are stacked. Since the insulating film 380 is made of materials having insulating properties, it is possible to prevent an electrical short circuit that may occur when the active layer 330 directly contacts an electrode through which an electric signal is transmitted to the light emitting element ED. Since the insulating film 380 protects the outer surface of the light emitting element ED including the active layer 330, it is possible to prevent degradation in light emission efficiency.

In the embodiment, the active layer 330 of the light emitting element ED may be disposed adjacent to an end of the light emitting element having a larger diameter with respect to the second reference line Ly which traverses the center of the light emitting element ED in the direction Y perpendicular to the extension direction X of the light emitting element ED. For the light emitting elements ED having the same shape, as the active layer 330 is disposed closer to the end of the light emitting element ED having a larger diameter, the average diameter of the active layer 330 may be increased. Accordingly, the volume of the active layer 330 may increase, thereby improving the light emission efficiency of the light emitting element ED.

It is possible to prevent the active layer 330 from being damaged by an etchant used in a process of vertically etching the semiconductor layers and electrode layers during a manufacturing process of the light emitting element ED. For example, in a manufacturing method of the light emitting element ED, semiconductor material layers, an active material layer, and an electrode material layer may be formed and then etched in the direction X to form the light emitting element core 300 extending in the direction X. A first semiconductor material layer is formed, the active material layer is formed on the first semiconductor material layer, a second semiconductor material layer is formed on the active material layer, and the electrode material layer is formed on the second semiconductor material layer. Thereafter, they may be etched in the direction X to form the light emitting element core 300 extending in the direction X. In order to form the first distance d1 in the direction X between the first surface S1 of the light emitting element ED and the top surface of the active layer 330 to be greater than the second distance d2 in the direction X between the second surface S2 of the light emitting element ED having the second diameter W2 greater than the first diameter W1 and the bottom surface of the active layer 330, the second semiconductor material layer may be formed to have a large thickness. Therefore, the active material layer may be positioned at a relatively lower portion. In a process of etching the light emitting element ED during the manufacturing process of the light emitting element ED, when the active material layer is etched by the etchant to form the active layer 330, since the active material layer is disposed at the lower portion, damage to the active layer 330 due to the etchant may be reduced. Accordingly, damage to the side surface of the light emitting element core 300 may be reduced, and thus the quality of the light emitting element ED may be improved.

FIG. 6 is a schematic diagram of a light emitting element according to another embodiment. FIG. 7 is a schematic side view illustrating an example of the light emitting element of FIG. 6.

Referring to FIGS. 6 and 7, a light emitting element ED_1 according to the embodiment is different from the light emitting element ED of FIGS. 4 and 5 in that a first semiconductor layer 310_1 includes sub-semiconductor layers 311, 312, and 313, a second semiconductor layer 320_1 includes sub-semiconductor layers 321 and 322, and an active layer 330_1 contains another element, phosphorus (P). The light emitting element ED_1 according to the embodiment may emit red light having a central wavelength band in a range of about 600 nm to about 750 nm. However, the central wavelength band of red light is not limited to the above-mentioned range, and includes all wavelength ranges that may be recognized as red light.

The first semiconductor layer 310_1 may include first, second, and third sub-semiconductor layers 311, 312, and 313. The first to third sub-semiconductor layers 311, 312, and 313 may be n-type doped semiconductors each having a first conductivity type.

The first sub-semiconductor layer 311 may include a semiconductor material having a composition ratio of InxGa(1−x)P (where 0<x≤1). The first sub-semiconductor layer 311 material may include at least one or more of n-type doped materials GaP, InGaP, and InP. For example, the first sub-semiconductor layer 311 may include n-GaInP doped with n-type Si.

The second sub-semiconductor layer 312 may be disposed between the first sub-semiconductor layer 311 and the active layer 330_1. The second sub-semiconductor layer 312 may be an n-type semiconductor layer and may include a semiconductor material having a composition ratio of InxAlyGa(1−x−y)P (where 0≤x≤1, 0≤y≤1, and 0≤x+y≤1). The second sub-semiconductor layer 312 material may include at least one of n-type doped materials InAlGaP, GaP, AlGaP, InGaP, AlP, and InP. For example, the second sub-semiconductor layer 312 may be n-AlGaInP doped with n-type Si.

The third sub-semiconductor layer 313 may be disposed between the second sub-semiconductor layer 312 and the active layer 330_1. The third sub-semiconductor layer 313 may be an n-type semiconductor layer and may include a semiconductor material having a composition ratio of InxAl(1−x)P (where 0≤x≤1). The third sub-semiconductor layer 313 material may include at least one or more of n-type doped materials AlInP, AlP, and InP. For example, the third sub-semiconductor layer 313 may be n-AlInP doped with n-type Si.

The second semiconductor layer 320_1 may include fourth and fifth sub-semiconductor layers 321 and 322. The fourth and fifth sub-semiconductor layers 321 and 322 may be p-type doped semiconductors each having a second conductivity type.

The fourth sub-semiconductor layer 321 may be disposed between the active layer 330_1 and the electrode layer 370. The fourth sub-semiconductor layer 321 may be a p-type semiconductor layer, and may include a semiconductor material having a composition ratio of InxAlyGa(1−x−y)P (where 0≤x≤1, 0≤y≤1, and 0≤x+y≤1). The fourth sub-semiconductor layer 321 may include at least one or more of p-type doped materials InAlGaP, GaP, AlGaNP, InGaP, AlP, and InP. For example, the fourth sub-semiconductor layer 321 may be p-GaP doped with p-type Mg.

The fifth sub-semiconductor layer 322 may be disposed between the fourth sub-semiconductor layer 321 and the active layer 330_1. The fifth sub-semiconductor layer 322 is a p-type semiconductor layer and may include a semiconductor material having a composition ratio of InxAl(1−x)P (where 0≤x≤1). The fifth sub-semiconductor layer 322 may include at least one or more of p-type doped materials AlInP, AlP, and InP. For example, the fifth sub-semiconductor layer 322 may be p-AlInP doped with p-type Mg.

FIG. 8 is a schematic side view showing another example of the light emitting element of FIG. 6.

Referring to FIG. 8, a light emitting element ED_2 according to the embodiment is different from the light emitting element ED_1 of FIG. 6 in that an active layer 330_2 has a side surface protruding outward than the side surface of the fifth sub-semiconductor layer 322 disposed at the upper portion and the side surface of the third sub-semiconductor layer 313 disposed at the lower portion.

The light emitting element ED_2 according to the embodiment may be formed by a difference in the etching selectivity for each semiconductor layer of the etchant used in a process of vertically etching the semiconductor layers and electrode layers during a manufacturing process of the light emitting element ED_2. For example, in a manufacturing method of the light emitting element ED_2, semiconductor material layers, an active material layer, and an electrode material layer may be formed and etched in the direction X to form a light emitting element core 300_2 extending in the one direction X. In a process of etching the light emitting element ED_2 during the manufacturing process of the light emitting element ED_2, since the semiconductor material layers and the active material layer have different etching selectivity for the same etchant, as shown in FIG. 8, the light emitting element ED_2 may be manufactured to have a shape in which the side surface of active layer 330_2 protrudes compared to the side surfaces of the semiconductor layers positioned at the upper portion and the lower portion of the active layer 330_2.

FIG. 9 is a schematic plan layout view showing a relative planar arrangement of first and second electrodes, first and second contact electrodes, a light emitting element, and a second insulating layer. FIG. 10 is an enlarged schematic cross-sectional view illustrating an example of area A of FIG. 3.

Hereinafter, the relative dispositions of the active layer 330 of the light emitting element ED, the electrodes 210 and 220, and the second insulating layer 520 disposed on the light emitting element ED will be described with reference to FIGS. 9 and 10.

As described above, one end of the light emitting element ED may have a different diameter than the other end of the light emitting element ED in the extension direction. The light emitting element ED may be disposed on the first insulating layer 510 such that one end is disposed on the first electrode 210 and the other end is disposed on the second electrode 220.

Hereinafter, for simplicity of description, one end (or the first end) of the light emitting element ED is an end having a smaller diameter and indicates the first surface S1 (refer to FIG. 4) of the light emitting element ED having the first diameter W1 (refer to FIG. 4). The other end (or the second end) of the light emitting element ED is an end having a larger diameter and indicates the second surface S2 (refer to FIG. 4) of the light emitting element ED having the second diameter W2 (refer to FIG. 4) larger than the first diameter W1. The one end of the light emitting element ED may be referred to as the first end and the other end may be referred to as the second end. The first semiconductor layer 310 may be adjacent to the second end of the light emitting element ED and the second semiconductor layer 320 may be adjacent to the first end of the light emitting element ED. The first end and the second end of the light emitting element ED may be inclined with respect to the substrate SUB (refer to FIG. 3). The first end and second end of the light emitting element ED may be inclined in the same direction towards the substrate SUB.

The first semiconductor layer 310, the active layer 330, the second semiconductor layer 320, and the electrode layer 370 included in the light emitting element core 300 of the light emitting element ED disposed on the first insulating layer 510 may be sequentially stacked along a direction opposite to the first direction DR1. However, since the light emitting element ED has a trapezoidal cross-sectional shape in which the diameters of the first end and the second end are different from each other, the boundary surfaces of the first semiconductor layer 310, the active layer 330, the second semiconductor layer 320, and the electrode layer 370 may be inclined with respect to the first direction DR1.

The active layer 330 of the light emitting element ED may be disposed on a side of the second end with respect to a cutting line that passes through the center of the light emitting element ED and is perpendicular to the extension direction of the light emitting element ED. In an embodiment in which the first end of the light emitting element ED where the electrode layer 370 is positioned is disposed above the first electrode 210, and the second end of the light emitting element ED where the first semiconductor layer 310 is positioned is disposed above the second electrode 220, the second electrode 220 may overlap the active layer 330 in the third direction DR3. The second electrode 220 may be disposed below the light emitting element ED to completely cover the active layer 330 of the light emitting element ED from below. At least a part of the active layer 330 may be disposed on the second electrode 220. It is illustrated in the drawing that the first end of the light emitting element ED is disposed above the first electrode 210 and the second end is disposed above the second electrode 220, but the arrangement relationship between both ends of the light emitting element ED and the first and second electrodes 210 and 220 is not limited thereto. For example, the first end of the light emitting element ED may be disposed above the second electrode 220 and the second end may be disposed above the first electrode 210. The first electrode 210 may be disposed below the light emitting element ED to completely overlap the active layer 330 disposed on a side of the second end of the light emitting element ED from below.

The second insulating layer 520 may be disposed on the light emitting element ED. The second insulating layer 520 may expose each of the first end and the second end of the light emitting element ED. The second insulating layer 520 may not overlap at least a part of the active layer 330 of the light emitting element ED in the third direction DR3. In an embodiment, the second insulating layer 520 may be disposed on the light emitting element ED such that the second insulating layer may not overlap the active layer 330 of the light emitting element ED in the third direction DR3 and expose the active layer 330 in third direction DR3.

The first contact electrode 710 and the second contact electrode 720 disposed on the second insulating layer 520 may electrically contact the first end and the second end of the light emitting element ED, respectively.

The first contact electrode 710 may electrically contact the electrode layer 370 constituting the first surface S1 (refer to FIG. 4) of the light emitting element ED on the first end of the light emitting element ED where the electrode layer 370 or the second semiconductor layer 320 is positioned. Similarly, the second contact electrode 720 may electrically contact the first semiconductor layer 310 constituting the second surface S2 (refer to FIG. 4) of the light emitting element ED on the second end of the light emitting element ED where the first semiconductor layer 310 is positioned.

FIG. 11 is an enlarged cross-sectional view showing the traveling direction of light emitted from a light emitting element ED.

Referring to FIGS. 4 and 11, light emitted from the active layer 330 of the light emitting element ED may be projected not only through the first and second surfaces S1 and S2, which are the end surfaces of the light emitting element ED in the extension direction, but also through the third surface S3, which is a side surface of the light emitting element ED.

Hereinafter, for simplicity of description, the light emitted from the active layer 330 of the light emitting element ED disposed on the first insulating layer 510 is divided into first to fourth lights L1, L2, L3, and L4 based on the traveling direction.

The first light L1 may be light emitted upward with respect to the light emitting element ED. The first light L1 may be emitted from the active layer 330 through the third surface S3 of the light emitting element ED positioned on a side of the fourth insulating layer 540.

As described above, the second insulating layer 520 may be disposed so as not to overlap the active layer 330 in the third direction DR3. By arranging the second insulating layer 520 and the active layer 330 to not overlap each other in the third direction DR3, the ratio of light incident on the second insulating layer 520 compared to the light emitted from the active layer 330 may be reduced, which may improve the light emission efficiency of the display device 10.

In case that the second insulating layer 520 overlaps the active layer 330 in the third direction DR3, most of the first light L1 emitted from the active layer 330 and then traveling upward (or in the third direction DR3) from the display device 10 may enter the second insulating layer 520. The second insulating layer 520 may have a thickness larger than the diameter of the light emitting element ED in order to fix the light emitting element ED, so the light incident on the second insulating layer 520 may not easily pass through the second insulating layer 520 and be emitted to the outside. Since the second insulating layer 520 is formed to have a refractive index greater than that of other members or greater than that of air, the light incident on the second insulating layer 520 may not pass through the boundary surfaces between the second insulating layer 520 and other members, and may be partially reflected (or totally reflected) back to the inside of the second insulating layer 520. Among the light emitted from the light emitting element ED, the light incident on the second insulating layer 520 is not easily emitted to the outside of the second insulating layer 520 due to the thickness or refractive index of the second insulating layer 520. Therefore, in case that the ratio of the light incident on the second insulating layer 520 among the light emitted from the light emitting element ED is high, the light emission efficiency of the display device 10 may be degraded. Accordingly, by arranging the active layer 330 of the light emitting element ED and the second insulating layer 520 not to overlap each other in the third direction DR3, the ratio at which the first light L1 emitted from the active layer 330 enters the second insulating layer 520 may be reduced, which may improve the light emission efficiency of the display device 10.

The second light L2 and the third light L3 may be light emitted through the end surfaces of the light emitting element ED. The second light L2 is mostly emitted through the first surface S1 of the light emitting element ED, and the third light L3 may be mostly emitted through the second surface S2 of the light emitting element ED. Although not shown in the drawing, the second light L2 may pass through the first contact electrode 710 and the third insulating layer 530 disposed at a side of the first end of the light emitting element ED to be incident on the first electrode 210 disposed on the first sub-bank 410. The second light L2 incident on the first electrode 210 may be reflected from the top surface of the first electrode 210, so that a traveling direction thereof may be changed to an upward direction (e.g., display direction). Similarly, the third light L3 may pass through the second contact electrode 720 disposed at a side of the second end of the light emitting element ED to be incident on the second electrode 220 disposed on the second sub-bank 420. The third light L3 incident on the second electrode 220 may be reflected from the top surface of the second electrode 220, so that a traveling direction thereof may be changed to an upward direction (e.g., display direction).

The fourth light L4 may be light emitted downward with respect to the light emitting element ED. The fourth light L4 may be emitted through the third surface S3 of the light emitting element ED positioned on a side of the first insulating layer 510 from the active layer 330.

As described above, the first electrode 210 or the second electrode 220 may be disposed to overlap at least a part of the active layer 330 in the third direction DR3. In an embodiment, the active layer 330 may overlap the second electrode 220 in the third direction DR3. By disposing the second electrode 220 and the active layer 330 to overlap each other in the third direction DR3, the ratio of the fourth light L4 that is reflected by the second electrode 220 and which the direction of light traveling is changed to the upward direction increases, thereby improving the light emission efficiency of the display device 10.

In case that the active layer 330 does not overlap either of the first electrode 210 and the second electrode 220 in the third direction DR3, most of the fourth light L4 emitted from the active layer 330 and traveling downward (or in a direction opposite to the third direction DR3) may be incident on the first insulating layer 510 and, without being reflected, may be converted into another energy (e.g., thermal energy) and absorbed into the circuit element layer PAL or the first insulating layer 510. Accordingly, since a part of the fourth light L4 is converted and absorbed by another component of the display device 10, the ratio of light emitted in the upward direction compared to the light emitted from the light emitting element ED is reduced, which may degrade the light emission efficiency of the display device 10. In case that the active layer 330 of the light emitting element ED overlaps the second electrode 220 in the third direction DR3, the ratio of light traveling to the second electrode 220 among the fourth light L4 may increase, and the fourth light L4 traveling to the second electrode 220 may be reflected from the top surface of the second electrode 220, so that the traveling direction of the fourth light L4 may be changed upward. Accordingly, by arranging the active layer 330 of the light emitting element ED and one of the first and second electrodes 210 and 220 to overlap each other in the third direction DR3, the ratio at which the fourth light L4 emitted from the active layer 330 is incident on the first electrode 210 or the second electrode 220 may increase, and thus the reflectance by the first and second electrodes 210 and 220 may increase, thereby improving the light emission efficiency of the display device 10.

In the embodiment, with respect to one surface of the active layer 330 facing the first surface S1 of the light emitting element ED and the other surface of the active layer 330 facing the second surface S2 of the light emitting element ED, the active layer 330 may be positioned such that the distance d1 between the first surface S1 of the light emitting element ED and the one surface of the active layer 330 is greater than the distance d2 between the second surface S2 of the light emitting element ED and the other surface of the active layer 330. Accordingly, the active layer 330 in the light emitting element ED is positioned adjacent to one side instead of the central portion, so that the relative arrangement relationship between the second insulating layer 520 and the first and second electrodes 210 and 220, which are disposed on and below the light emitting element ED provided on the substrate SUB of the display device 10, may be easily adjusted to improve the light emission efficiency of the display device 10. Since the active layer 330 is positioned adjacent to the second end having the second diameter larger than the first diameter, the average diameter of the active layer 330 becomes larger than that in a case where the active layer 330 is disposed on a side of the first end having a smaller diameter. Therefore, the volume of the active layer 330 may increase. Accordingly, in the light emitting element ED having the same shape, since the volume of the active layer 330 increases, the light efficiency of the light emitting element ED may increase, and thus the light emission efficiency of the display device 10 may be improved.

Hereinafter, other embodiments will be described. In the following embodiments, a description of the same components as those of the above-described embodiment will be omitted or simplified to avoid redundancy, and differences will be described.

FIG. 12 is an enlarged cross-sectional view illustrating another example of area A of FIG. 3.

Referring to FIG. 12, the display device 10 according to the embodiment is different from that in the embodiment of FIG. 10, in that a second insulating layer 520_1 overlaps a part of the active layer 330 of the light emitting element ED in the third direction DR3.

The second insulating layer 520_1 may be disposed to overlap a part of the active layer 330 of the light emitting element ED in the third direction DR3, and not to overlap the other part of the active layer 330 of the light emitting element in the third direction DR3. A part of the active layer 330 that overlaps the second insulating layer 520_1 may be smaller in area or volume than the other part of the active layer 330 that does not overlap the second insulating layer 520_1. Accordingly, even though the second insulating layer 520_1 is disposed to partially overlap the active layer 330, the overlapping area is smaller than the non-overlapping area in a plan view. Therefore, the ratio of light emitted from the active layer 330 and then incident on the second insulating layer 520_1 may not be large. Accordingly, the ratio of the light emitted from the active layer 330 and then incident on the second insulating layer 520 may be reduced while fixing the light emitting element ED more stably.

FIG. 13 is an enlarged cross-sectional view illustrating still another example of area A of FIG. 3.

Referring to FIG. 13, the display device 10 according to the embodiment is different from that in the embodiment of FIG. 10 in that one of the electrodes 210_1 and 220_1 covers only a part of the active layer 330 without completely covering the active layer 330 from below the light emitting element ED.

A distance between a first electrode 210_1 and a second electrode 220_1 in the first direction DR1 may be greater than a distance between the first electrode 210 and the second electrode 220 of FIG. 10. Accordingly, the second electrode 220_1 may not cover at least a part of the active layer 330 from below the active layer 330. The second electrode 220_1 may be disposed so as not to overlap a part of the active layer 330 in the third direction DR3.

FIG. 14 is a cross-sectional view illustrating another example taken along line I-I' of FIG. 2.

Referring to FIG. 14, the display device 10 according to the embodiment is different from that in the embodiment of FIG. 3 in that a second contact electrode 720_1 is formed on the same layer as the first contact electrode 710, and the third insulating layer 530 is omitted.

The first contact electrode 710 and the second contact electrode 720_1 may be directly disposed on the second insulating layer 520. Although not limited to the following, the first contact electrode 710 and the second contact electrode 720_1 may be patterned by one mask process and formed simultaneously. The first contact electrode 710 and the second contact electrode 720_1 may be spaced apart from each other on the second insulating layer 520 to expose a part of the second insulating layer 520. The second insulating layer 520 exposed by the first contact electrode 710 and the second contact electrode 720_1 may contact the fourth insulating layer 540 in the exposed area.

In the embodiment, even if the third insulating layer 530 is omitted in the display device 10, the second insulating layer 520 may include an organic insulating material and perform a function of fixing the light emitting element ED. Since the first contact electrode 710 and the second contact electrode 720_1 are patterned by a mask process and formed in the same process, an additional mask process is not required to form the first contact electrode 710 and the second contact electrode 720_1, so that process efficiency may be improved. The embodiment is the same as the embodiment of FIG. 3 except that the third insulating layer 530 is omitted, and thus a duplicate description will be omitted.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a substrate;
   a first electrode and a second electrode spaced apart from each other and disposed on a surface of the substrate;
   a light emitting element extending in a first direction;
   an insulating layer disposed on and directly above the light emitting element;
   wherein
   the light emitting element comprises:
      a first end disposed on the first electrode in the first direction; and
      a second end disposed on the second electrode in the first direction,
      the first end of the light emitting element and the second end of the light emitting element are inclined with respect to the substrate,
      a diameter of the first end of the light emitting element is different from a diameter of the second end of the light emitting element,
   the light emitting element further comprises:
      a first semiconductor layer;
      a second semiconductor layer spaced apart from the first semiconductor layer;
      an active layer disposed between the first semiconductor layer and the second semiconductor layer; and
      an insulating film directly contacting side surfaces of the first semiconductor layer, the second semiconductor layer, and the active layer,
   wherein
   the active layer is closer to one of the first end and the second end of the light emitting element having a larger diameter,
   the insulating film does not cover an end surface of the light emitting element having the larger diameter as seen from a perspective view of the light emitting element facing the end surface of the active layer having the larger diameter, the insulating layer comprises a first surface which directly contacts the light emitting element and a second surface opposite to the first surface, the first surface of the insulating layer does not include any portion which is parallel to the second surface of the insulating layer in a cross-sectional view, an entirety of the active layer overlaps the second electrode in a thickness direction of the substrate, and the thickness direction of the substrate is a direction perpendicular to the surface of the substrate.

2. The display device of claim 1, wherein the diameter of the second end of the light emitting element is greater than the diameter of the first end of the light emitting element, and at least a part of the active layer is disposed on the second electrode.

3. The display device of claim 2, wherein the second semiconductor layer is adjacent to the first end of the light emitting element, and the first semiconductor layer is adjacent to the second end of the light emitting element.

4. The display device of claim 3, wherein a thickness of the first semiconductor layer in the first direction is smaller than a thickness of the second semiconductor layer in the first direction.

5. The display device of claim 3, wherein the light emitting element emits red light having a central wavelength band in a range of about 600 nm to about 750 nm.

6. The display device of claim 3, wherein each of the first semiconductor layer and the second semiconductor layer includes phosphorus.

7. The display device of claim 3, wherein a minimum diameter of the first semiconductor layer is greater than a maximum diameter of the second semiconductor layer.

8. The display device of claim 7, wherein a diameter of the active layer decreases from the first semiconductor layer to the second semiconductor layer.

9. The display device of claim 2, wherein the light emitting element includes:

a first surface which is a surface of the first end of the light emitting element;

a second surface which is a surface of the second end of the light emitting element; and a third surface connecting the first surface and the second surface, and a first distance in the first direction between the first surface and a surface of the active layer facing the first surface is greater than a second distance in the first direction between the second surface and another surface of the active layer facing the second surface.

10. The display device of claim 9, wherein the light emitting element has a trapezoidal shape in a cross-sectional view taken in the first direction.

11. The display device of claim 1, wherein the second electrode is disposed below the active layer and completely covers the active layer in the thickness direction of the substrate.

12. The display device of claim 1, wherein a diameter of the light emitting element decreases in the first direction.

13. The display device of claim 1, wherein the first semiconductor layer, the active layer, and the second semiconductor layer are sequentially disposed in the first direction.

14. The display device of claim 1, wherein the insulating layer exposes the first end of the light emitting element and the second end of the light emitting element, and the insulating layer does not overlap at least a part of the active layer in the thickness direction of the substrate.

15. The display device of claim 14, wherein the active layer includes:

a first region overlapping the insulating layer; and a second region not overlapping the insulating layer in the thickness direction of the substrate, and a thickness of the first region in the first direction is smaller than a thickness of the second region in the first direction.

16. The display device of claim 1, further comprising:

a first contact electrode electrically contacting the first end of the light emitting element and the first electrode; and a second contact electrode electrically contacting the second end of the light emitting element and the second electrode, wherein the first contact electrode and the second contact electrode are electrically disconnected from each other.

17. The display device of claim 1, wherein the first end of the light emitting element and the second end of the light emitting element are inclined in a same direction toward the substrate.

18. The display device of claim 1, wherein the insulating film does not cover an end surface of the active layer having the larger diameter as seen from the perspective view of the light emitting element facing the end surface of the active layer having the larger diameter.

19. The display device of claim 1, further comprising:

a first insulating layer disposed on the substrate, wherein the first electrode and the second electrode are disposed between the substrate and the first insulating layer, the light emitting element is disposed directly on the first insulating layer, and the light emitting element does not directly contact the first electrode and the second electrode.

20. A display device comprising:

a substrate;

a first electrode and a second electrode spaced apart from each other and disposed on the substrate;

a light emitting element extending in a first direction; and an insulating layer disposed on and directly above the light emitting element, wherein the light emitting element comprises:

a first end disposed on the first electrode in the first direction; and a second end disposed on the second electrode in the first direction, wherein the first end of the light emitting element and the second end of the light emitting element are inclined with respect to the substrate, a diameter of the first end of the light emitting element is different from a diameter of the second end of the light emitting element, the light emitting element further comprises:

a first semiconductor layer;

a second semiconductor layer spaced apart from the first semiconductor layer;

an active layer disposed between the first semiconductor layer and the second semiconductor layer; and an insulating film directly contacting side surfaces of the first semiconductor layer, the second semiconductor layer, and the active layer, wherein the active layer is closer to one of the first end and the second end of the light emitting element having a larger diameter, the insulating film does not cover an end surface of the light emitting element having the larger diameter, the insulating layer comprises a first surface which directly contacts the light emitting element and a second surface opposite to the first surface, the first surface of the insulating layer does not include any portion which is parallel to the second surface of the insulating layer in a cross-sectional view, and the active layer does not overlap the insulating layer in a thickness direction of the substrate.

* * * * *